(12) United States Patent
Lee

(10) Patent No.: US 7,872,297 B2
(45) Date of Patent: Jan. 18, 2011

(54) FLASH MEMORY DEVICE AND FABRICATING METHOD THEREOF COMPRISING A BODY RECESS REGION

(75) Inventor: Jong-Ho Lee, Daegu (KR)

(73) Assignee: SNU R&DB Foundation, Seoul (KR)

( * ) Notice: Subject to any disclaimer, the term of this patent is extended or adjusted under 35 U.S.C. 154(b) by 246 days.

(21) Appl. No.: 11/736,114

(22) Filed: Apr. 17, 2007

(65) Prior Publication Data

US 2008/0258199 A1 Oct. 23, 2008

(51) Int. Cl.
*H01L 29/788* (2006.01)

(52) U.S. Cl. ............. 257/316; 257/330; 257/466; 257/496; 257/321; 257/E29.2; 257/E29.309; 257/E29.3; 438/259

(58) Field of Classification Search ............. 257/316, 257/466, 496, E29.2, 330, E29.309, 321, 257/E29.3; 438/259
See application file for complete search history.

(56) References Cited

U.S. PATENT DOCUMENTS

| | | | | |
|---|---|---|---|---|
| 6,157,061 | A * | 12/2000 | Kawata | 257/316 |
| 6,717,205 | B2 * | 4/2004 | Gratz | 257/316 |
| 6,768,158 | B2 * | 7/2004 | Lee et al. | 257/315 |
| 6,885,055 | B2 | 4/2005 | Lee | |
| 7,005,055 | B2 | 2/2006 | Kumagai et al. | |
| 7,276,763 | B2 * | 10/2007 | Yeo et al. | 257/328 |
| 7,399,673 | B2 * | 7/2008 | Tempel | 438/259 |
| 2004/0256665 | A1 * | 12/2004 | Birner et al. | 257/329 |
| 2005/0077568 | A1 * | 4/2005 | Park et al. | 257/330 |
| 2005/0128804 | A1 * | 6/2005 | Forbes | 365/185.01 |

FOREIGN PATENT DOCUMENTS

| | | |
|---|---|---|
| JP | 2003-298051 | 10/2003 |
| KR | 10-0458288 | 11/2004 |

OTHER PUBLICATIONS

English language Abstract of KR 10-0458288.
Eitan et al., "NROM: A novel localized trapping, 2-bit nonvolatile memory cell", IEEE Electron Devices, vol. 21, No. 11, pp. 543-585, 2000.
Fukuda et al., "Scaled 2 bit/cell SONOS type nonvolatile memory technology for sub-90 nm embedded application using SiN sidewall trapping structure", IEDM Tech. Dig., pp. 909-912, 2003.
Choi et al., "Highly scalable and reliable 2-bit/cell SONOS memory transistor beyond 50 nm NVM technology", Symposium on VLSI Technology Dig., pp. 118-119, 2005.

* cited by examiner

*Primary Examiner*—Matthew E Warren
*Assistant Examiner*—David Z Chen
(74) *Attorney, Agent, or Firm*—Greenblum & Bernstein, P.L.C.

(57) ABSTRACT

The present invention relates to a flash memory device and its fabrication method. The device comprises a structure for improving a scaling-down characteristic/performance and increasing memory capacity of the MOS-based flash memory device. A new device structure according to the present invention is based on a recessed channel capable of implementing highly-integrated/high-performance and 2-bit/cell. The proposed device suppresses the short channel effect, reduces the cell area, and enables 2-bit/cell by forming the charge storage node as a spacer inside the recessed channel. Moreover, if selectively removing the dielectric films around the recessed silicon surface, the sides as well as the surface of the recessed channel is exposed. A spacer can be used as a storage node, thereby improving the channel controllability of the control electrode and the on-off characteristic of a device. The proposed structure also resolves the threshold voltage problem and improves the write/erase speeds.

20 Claims, 21 Drawing Sheets

FLASH MEMORY DEVICE AND FABRICATING METHOD THEREOF COMPRISING A BODY RECESS REGION

TECHNICAL FIELD

The present invention relates to a flash memory device and its fabrication method, in more detail, it relates to a novel device structure for improving a scaling-down characteristic/performance and increasing memory capacity of the MOS-based flash memory device.

BACKGROUND ART

With recent ever increasing demands for a flash memory in consumer electronics and portable electronic devices, flash memory is highly marketable, and thus the market is expected to exceed that of the existing DRAM around the year 2007. On the other hand, it is continuously required for memory devices to be highly integrated and fast in write/erase time.

The down-scaling of the existing flash memory devices having under 60 nm scale gate length is in the verge of limitation. In order to increase the speed of write and read time in existing planer channel device structure, the capacitance between control gate and floating storage electrode should be increased. Also, the coupling ratio, what is called, should be increased, and to do this, the width of a floating gate should be thick in existing device structure. In this case, though the gate length of a device is reduced, the thickness of a floating gate can not be reduced because the coupling ratio should be maintained in more than 0.6. If the size of a device having thick floating gate is reduced, the capacitance between devices is increased, thereby causing a cross-talk between cells, leading to increase the distribution of threshold voltage, and thus stumbling large scale integration. Likewise, the existing devices have difficulties in down-scaling a device, improving read/write speeds, reducing cross-talk, and the like.

One method for resolving these problems is to recess the channel region. While the recess depth gets deeper and the corner region formed on the floor of the recessed channel is shaped as round, the sensitivity of threshold voltage is very high according to the doping concentration or profile of a corner region. Moreover, in these recessed devices, the variation of threshold voltage according to substrate bias is much greater than in the existing planer channel structure, and the effective channel length is increased by the channel recess. Thus, there is a disadvantage of degrading the current driving capability when the channel width becomes narrow.

The general feature of the recessed channel devices is that the channel controllability of control electrode is inferior to that of the planer channel devices. This is associated with a large substrate bias effect. The weakened channel controllability of a control electrode takes disadvantage of slowing write/erase characteristics through the control electrode.

In the double/triple-gate MOS structure, the gate wraps the channel region. In this case, the gate electrode is excellent in the channel controllability. The applicant of the present invention has first in the world proposed a body-tied double/triple-gate MOS structure (Patent Filing No.: 2002-5325 (KR), JP2003-298051(JP), U.S. Ser. No. 10/358,981) and its application to a flash memory (Korean Patent Registration No.: 0420070, U.S. patent Ser. No. 10/751,860). The applicant named this structure as a bulk FinFET. In this structure, since the channel is formed at upper side and both sidewalls of active body or at both sides of active body just as it is not recessed, the channel controllability of the gate is much more excellent than that of the existing planer channel device, and thus mostly there is no substrate bias effect. However, the width of the body should be reached around ⅔ of the physical gate length in order to suppress the short channel effect. This means that a silicon body is formed with narrower width than the minimum gate length, and thereby causing a problem in a fabrication process.

In the case of attempting to improve simply the problem associated with the down-scaling of the existing flash memory device, SONOS-type flash memory or NFGM (Nano Floating Gate Memory) can be applied to solve the problem. SONOS-type flash memory device is characterized in that 2-bit can be stored in a cell. Wherein, each 1-bit can be respectively stored in source side and drain side channel because the storage node is a dielectric layer. As a precedent, there has been an attempt to store 2-bit per a cell by using SONOS in the existing planar channel device structure (B. Eitan et al., "NROM: A novel localized trapping, 2-bit non-volatile memory cell," IEEE Electron Devices, vol. 21, no. 11, p. 543, 2000). However, the physical length of the channel should be at least 100 nm to store 2-bit per a cell. The reason is as follow: If the channel length of a device becomes shorter, the distance between source and drain gets closer. And it is easy that the charges stored in one side spreads to another side under a certain temperature, and thereby, easily losing the memory information.

FIG. 1 shows graphs describing as an ordinary ITRS (International Technology Roadmap for Semiconductors) roadmap. 4-bit per a cell is required as a storable bit number around 2010 from 2-bit at present. Thereby, the charges that can be in source and drain sides should not influence on each other, and the easiest method to solve this problem is to make the channel length long. As shown in FIG. 1, the down-scaling of a general flash memory is underway below 100 nm since 2004, and the gate length with about 20 nm is required in 2018 or thereabouts. Especially, the gate length of SONOS technology is required to be about 170 nm in 2005 and also required to be about 140 nm in 2018. This is the reason why the gate length is required to be long enough for storing 2-bit per a cell as described above.

DISCLOSURE

Technical Problem

Basically if the physical gate length is shortened, the integration density of a device is largely improved. But, in case of SONOS flash technology, if the gate length is reduced to about or less than 100 nm, there is a problem that the charge stored after program is redistributed or spreads. As a solution of this problem, a structure for separately storing the charge in source and drain sides was proposed (M. Fukuda et al, "Scaled 2 bit/cell SONOS type nonvolatile memory technology for sub-90 nm embedded application using SiN sidewall trapping structure," in IEDM Tech. Dig., p. 909, 2003). This structure can make the gate length of SONOS flash memory device down-scaled up to below 100 nm. However, since the nitride film spacer at both sides of the control electrode (gate) is used for a storage node, the practical gate length including a spacer (which is a storage electrode) is longer than the length of a single control electrode, thereby causing a problem in down-scaling. Moreover, there is a disadvantage in that the charge can not be easily stored or removed by the control electrode because the storage node is made of the nitride film spacer. To resolve these problems of the above structures, the structure as shown in FIG. 2 was proposed (B. Y. Choi et al., "Highly scalable and reliable 2-bit/cell SONOS memory transistor beyond 50 nm NVM technology," in Symposium on VLSI Technology Dig., p. 118, 2005). In this structure, so-called inner sidewall scheme is applied. The scheme is different from the existing gate forming processes in that it first opens the region where the gate electrode will be formed and then the gate is formed. Thus, the total gate length including the spacer sidewall can be reduced to about 80 nm, thereby improving the integration density of a device. If it is taken into account that the length of the nitride film formed under a spacer is respectively about 20 nm in source and drain sides, the length of the control electrode located at the center becomes about 40 nm. However, if the total gate length including a spacer is made to be reduced to below 50 nm, the length of a control gate and a nitride film which is a storage node should be much more reduced. By doing this, the voltage difference between programming and erasing of a memory is to be reduced, and the short channel effect associated with reducing the gate length in the planar channel structure is appeared, so that the problems related to reducing the threshold voltage shift and increasing the leakage current are occurred. Therefore, it is required to develop a highly integrated/high-performance flash memory device having a novel structure resolving the problems for existing devices described above.

Technical Solution

Accordingly, the present invention is proposed for solving the above-mentioned problems, and it is an object, in realizing a MOS-based ultra small sized flash memory device, to provide a flash memory device having a superior down-scaling characteristic, being capable of reducing the threshold voltage distribution, being capable of storing 2-bit/cell, and being capable of improving the write/erase characteristic. Moreover, it is another object, while including superior down-scaling characteristic which a recessed-channel device takes advantage of, to provide a flash memory device capable of; 1) improving the channel controllability of the control electrode, 2) resolving the threshold voltage problem, 3) improving the on-off characteristic, and 4) improving the write/erase speeds.

As a technical idea for achieving the above-mentioned objects, the present invention provides a flash memory device, characterized by the structure comprising;

a wall-type semiconductor body region formed to be connected on a semiconductor substrate; a first dielectric film formed on the surface of said substrate and body region; a second field dielectric film for device isolation formed on said first dielectric film up to near the surface of the body region; a body formed to be recessed with a predetermined width and depth from the body surface for the recessed channel part formed on the surface of said body region;

a recessed wall-type semiconductor body formed by recessing the second field dielectric film and the first dielectric film with a predetermined depth from the surface along with the region which a control electrode is formed, wherein the second field dielectric film is patterned together with mask pattern performed for said recessed body and the first dielectric film is formed on the sides of the body region; a third tunneling dielectric film formed on the surface and a part of the sidewalls of said recessed wall-type semiconductor body;

a charge storage node formed on a predetermined position of the vertical surface and a part of the sidewalls in said recessed region; the charge storage node formed so as to be isolated between cells; a fourth dielectric film between electrodes and a control electrode formed successively; a source/drain formed on a predetermined position of said wall-type body region;

a fifth dielectric film, a contact, and a metal layer formed with a predetermined width on said resulting structure.

The present invention also provides a method for fabricating a flash memory device, comprising the steps of:

forming a first dielectric film and a second field dielectric film on a wall-type semiconductor body region formed to be connected on a semiconductor substrate;

forming a third dielectric film for a recess region formation, and etching the wall-type body exposed after removing the third dielectric film, which is previously formed for a recess region, through a mask work, so as to be formed with shallower depth than the finally recessed depth, forming a fourth dielectric film after performing the surface treatment process for said recessed wall-type semiconductor body;

forming a charge storage node on said resulting structure, that is forming a spacer type charge storage node through anisotrophic etching;

etching the semiconductor body exposed after removing said fourth dielectric film, and forming the corner formed near the floor of the finally recessed region as a round shape;

forming a fifth tunneling dielectric film after performing the surface treatment process for said recessed semiconductor body;

forming a sixth inter-electrode dielectric film on said resulting structure and then forming a control electrode;

etching a charge storage node exposed after removing said third dielectric film, up to a predetermined depth from the body surface which is not recessed;

forming a source/drain, an interlayer dielectric film, a contact, and a metal layer in order on said wall-type body region.

ADVANTAGEOUS EFFECTS

As described above, since multiple-bit flash memory device in accordance with the present invention has the recessed-channel structure and the triple-gate structure, it has both advantages of the existing double/triple-gate structure and the recessed-channel structure. Additional advantages together with these advantages are as follows:

As a first advantage, the existing bulk FinFET requires the active body width corresponding to ⅔ of the gate length, whereas the structure in accordance with the present invention has no problem even when making the body width equal to the 2-dimensional gate length, thereby provides the advantages intended in the present invention. The structure can also improve the fast erase characteristic through a body and write/erase characteristic through the increase of the channel controllability of the control electrode, and reduce the threshold voltage shift according to the substrate bias and the change of impurity density on the corner of the recessed-channel.

As a second advantage, since the channel is formed at the sidewalls as well as the surface of the recessed channel, the structure in accordance with the present invention can reduce the threshold voltage distribution of the flash memory device according to the high current driving capability and the increased effective channel area. The increase of the effective channel area is characterized by largely reducing the threshold voltage distribution in either case that uses a nitride film or high-k dielectrics as a storage node or nano-scale dots as a floating storage node.

As a third advantage, since the junction depth of a source/drain can be made deep, the structure in accordance with the present invention can greatly improve the erase speed through source, drain, or both the source and drain, as compared to the existing planer channel structure. In the structure, since the charge storage node is formed only on the vertical surface and sidewalls except near the floor of the recessed area, the charge storage node is separated each other centering around the floor of the recessed region. As a result, the redistribution of the charges stored through program can be reduced, and thereby improving the memory characteristics.

As a fourth advantage, since 1-bit can be stored in each source and drain respectively in the case that the material of the charge storage node is composed with a dielectric material or nano-scale dots, it is possible to realize 2-bit/cell. the structure in accordance with the present invention is characterized in that 2-bit/cell can be realized even when the material of storage node is conductive material in case that the storage electrode is completely separated as the form of a spacer.

DESCRIPTION OF DRAWINGS

FIG. 3(a) shows a cross-sectional view of the device including the region in which the storage electrode can store charges, and FIG. 3(b) shows a three-dimensional perspective view for apparently showing the principal parts near the body including the steps before the control dielectric film of region 8 is formed in the cross-sectional view of FIG. 3(a).

FIG. 18(a)-FIG. 20(a) and FIG. 18(b)-FIG. 20(b) indicate the range being doped and peak density position (assuming Gaussian distribution) with dash dot line, in order to indicate the body doping in the cross-sectional view for the device structure according to the present invention.

DESCRIPTION OF REFERENCE NUMERALS USED IN THE DRAWINGS

| | |
|---|---|
| 1: a silicon substrate | 2: a wall-type silicon body |
| 3: a first dielectric film | 4: a source/drain |
| 5: a second dielectric film(field dielectric film or isolating dielectric film) | |
| 6: a tunneling dielectric film | 7: a charge storage node |
| 8: an inter-electrode dielectric film(or a control dielectric film) | |
| 9: a control electrode | 10: a charge storage nano dot |
| 11: a third dielectric film | 12: a fourth dielectric film |

MODE FOR INVENTION

Hereinafter, referring to appended drawings, the structures and operational principles for the embodiments of present invention are described in detail.

Figure 1:
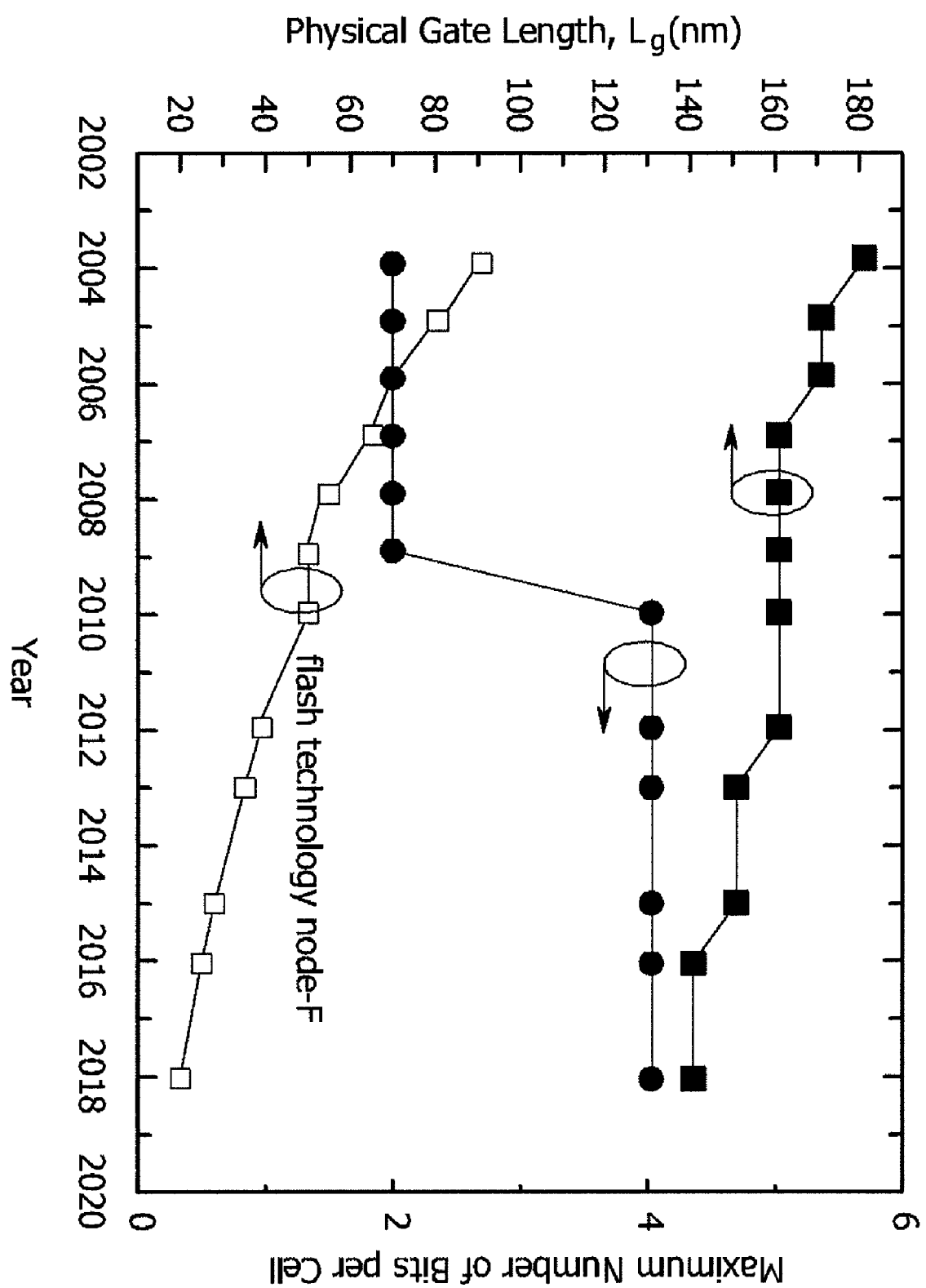
FIG. 1 shows graphs of ITRS roadmap presented in 2003 classified by year for the gate length and maximum storage bits numbers per a cell of SONOS flash memory.
Figure 2:
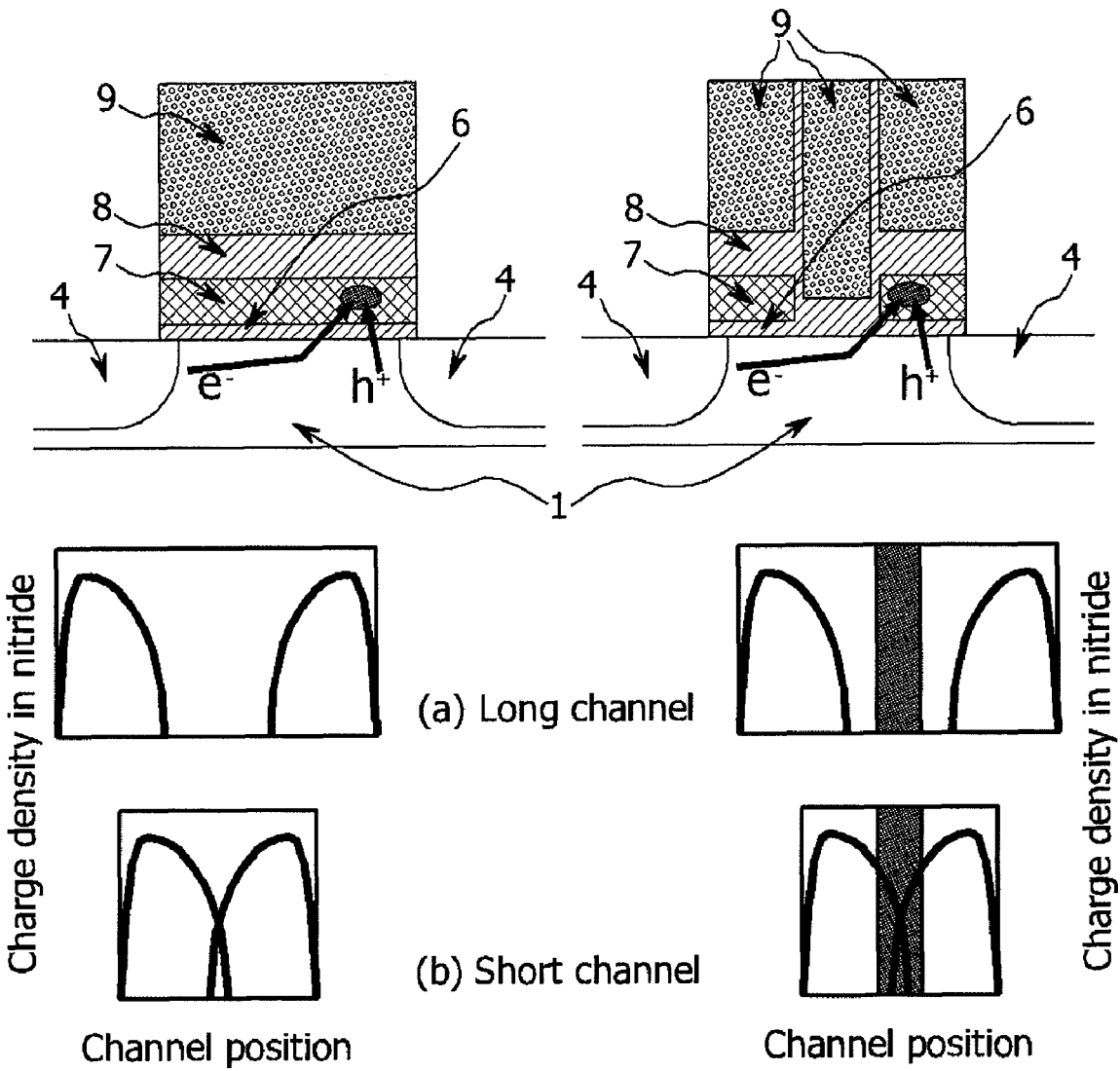
FIG. 2 shows cross-sectional views for SONOS flash device structures in accordance with prior arts; (top left figure) a conventional planer channel SONOS flash memory device, (top right figure) a device structure implemented by forming a nitride film only under the control electrode formed as a spacer for the purpose of improving integration density while implementing 2-bit/cell on the existing structure, and (bottom figures) brief charge density in nitride.
Figure 3:
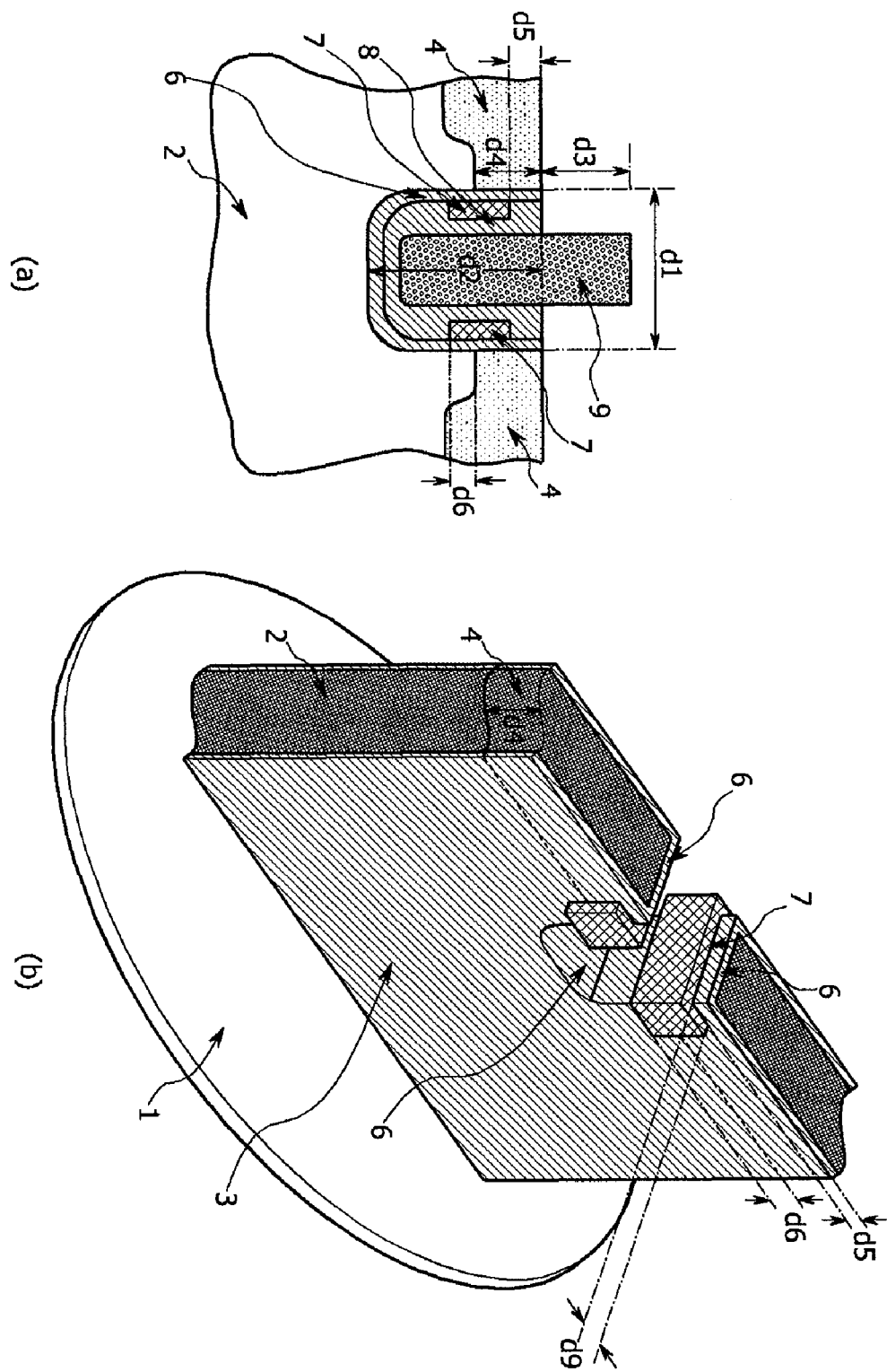
FIG. 3 shows a cross-sectional view of the recessed channel type flash memory device according to the present invention.

In the present invention, proposed a novel device structure settling the problems residing in the existing 2-bit/cell structures. FIG. 3(a) shows a cross-sectional view of the device proposed in the present invention, and FIG. 3(b) precisely shows the structure of the present invention, where the process is carried out up to the previous steps which the inter-electrode dielectric film is formed.

In FIG. 3(b), the field dielectric film region (5) of the truly existing region shows a recessed region and the principal structure around a wall-type body is also shown. In FIG. 3(b), the elliptic region (1) indicates a silicon wafer substrate. Basically, the principal parts of a device including storage nodes and channels are made in a recessed region. The width of the wall-type body is suitably formed in a range between 4 nm and 200 nm, the height of wall-type body formed on the substrate region (1) is suitably formed in a range from 100 nm to 1000 nm. As shown in FIG. 3(b), the width of wall-type body can be made of the same width from the body surface to the substrate of region (1), and in some cases the body width can be formed to be gradually increased from the body surface to the substrate of region (1), or the body width can be formed on the substrate of region (1) to be maintained with an uniform thickness up to a suitable depth from the body surface and then to be gradually increased.

If a channel is made in the recessed region, the channel length longer than the recess region open width (d1) (looked from the topside in two-dimension drawing) can be implemented. Thus, so-called short channel effect can be largely suppressed. It is a technical feature of the structure according to the present invention. The proper size of d1 is properly formed in a range between 10 nm and 200 nm. The recessed depth indicated by d2 is the recessed depth from the wall-type body surface of region (2) as shown in FIG. 3(a). The proper value of d2 is determined in a range between 20 nm and 900 nm. In FIG. 3(a), d3 indicates the height of the control electrode of region (9) protruded to an arbitrary height in the wall-type body surface, and the proper height of d3 is determined in a range between 100 nm and 900 nm, with the wall-type body surface of region (2) as a central position. The source/drain depth of region (4) indicated by d4 is indicated with the depth of LDD (Lightly Doped Drain) as a reference. The proper depth of d4 is determined in a range between 2 nm and 150 nm. The source/drain doping having higher density can exist nearby LDD, and the junction depth of the source/drain region having higher density than LDD can be equal to or deeper than d4. For NAND flash applications, the source/drain adopting only LDD can be used, and whereas, for NOR flash applications, it is required that hot carrier can be easily formed by increasing the density of LDD. The maximum impurity density of LDD for NAND flash applications is properly determined in a range between $1 \times 10^{18}$ cm$^{-3}$ and $8 \times 10^{19}$ cm$^{-3}$. And the maximum impurity density of the source/drain region (including the source/drain region overlapped with the control electrode) for NOR flash applications is determined in a range between $5 \times 10^{18}$ cm$^{-3}$ and $5 \times 10^{21}$ cm$^{-3}$.

In FIG. 3(b), d5 indicates the distance from the wall-type body surface to the storage node of region (7), and the distance of d5 is determined in a range between 1 nm and 100 nm. Though the storage node of region (7) can be formed vertically up to a suitable depth from the wall-type body surface, the depth is required to be controlled for adequate memory operations in order to inhibit unnecessary charge redistribution. The vertical length of region (7) storing electric charges can be properly controlled for storing 2-bit or more bits per a cell, and it is properly determined in a range between 2 nm and 300 nm. Various high-k materials including existing silicon oxide film can be used for the tunneling dielectric film of region (6). The thickness of the tunneling dielectric film is properly determined in a range between EOT (equivalent oxide thickness with the silicon oxide film as a reference) 0.5 nm and 9 nm. The tunneling dielectric film can be more thickly formed around the recessed floor rather than the sidewalls of the recessed region.

Moreover, in FIG. 3(a), the tunneling dielectric film of region (6) except for the tunneling dielectric film of region (6) being touched with the storage node of region (7), that is, the tunneling dielectric film of region (6) which is not touched with region (7), can be more thickly formed. And the thickness of that kind of thick dielectric film can be properly determined in a range between 1 nm and 20 nm. d6 indicates the length of the storage node of region (7) formed as a channel region from the source/drain junction depth. The vertical length of region (7) which is the charge storage node is properly determined in a range between 2 nm and 300 nm. The thickness of region (7) is properly determined in a range between 1 nm and 50 nm. One of a conductive material and a dielectric material which are capable of storing the electric charges can be used for the material of the storage node. The storage node can be made of a conductive material, such as polysilicon, poly-SiGe, amorphous silicon, amorphous SiGe, and various metals. Also the storage node can be made of a dielectric material like the material (or high-k materials) having the high dielectric constant including nitride film capable of trapping the electric charges can be the insulator used as the storage node.

Moreover, the charge storage node can be composed of a plurality of nano-scale dots. Nano-scale dot can be made of semiconductors such as silicon, Ge, SiGe, which are capable of storing electric charges, metals having various work functions, and silicide materials having various work functions. It is characterized in that the size of nano-scale dots used for the charge storage node of region (7) is determined in a range between 1 nm to 40 nm. The shape of dots is characterized by being formed with a spherical shape, a hemispherical shape, an elliptical shape, a pyramid shape with round corners and edges, and the shape having a hemispherical upside and an arbitrarily shaped rectangular downside while having round corners and edges. a predetermined vertical position in which the charge storage node of region (7) within the recessed region is ended is indicated as d6. d6 can be expanded to the tunneling dielectric film of region (6) formed in the floor of recessed region. And d6 is properly determined in a range between 1 nm and 150 nm. Region (8) is a dielectric layer formed between the storage node of region (7) and the control electrode of region (9). The thickness of region (8) is determined in a range between 2 nm and 30 nm. The structure of region (8) can be composed of a single dielectric film or a multi-dielectric film like an oxide-nitride-oxide (ONO). Furthermore, so-called high-k dielectric with higher dielectric constant than silicon oxide film can be used for increasing coupling ratio.

The control electrode of region (9) can be composed of polysilicon (i.e., n-type or p-type), poly-Ge (i.e., n-type or p-type), poly SiGe (i.e., p-type or n-type), various silicide materials, binary metals such as TiN and TaN, and single metal like tungsten (W). In FIG. 3(b), the storage node of region (7) wraps parts of the surface and the sidewalls of the recessed wall-type body. In this way, it is possible to improve the on-off characteristic, as compared to the structures which do not wrap the sides, by increasing the channel controllability. Of course, since the storage node wraps, it increases the threshold voltage shift according to the write operation, thereby increasing the program window. This can be also a technical feature of the structure according to the present invention. In this manner, it has the advantage of improving the operating characteristic by forming the storage node of region (7) only on the necessary region for the flash memory operations. The recess region is formed in the wall-type silicon body of region (2), and each vertical length of the charge storage node of region (7) formed in the vertical surface and the sides of the recessed region can be equally or differently formed.

In FIG. 3(b), d9 indicates the inner width (or distance) of the storage node covering the sides of the recessed region, and it is properly determined in a range between 1 nm and 50 nm. There are two corners around the recessed region floor, and the shapes can be formed as a right angle or an obtuse angle. Preferably, it can be shaped as round, as shown in FIG. 3(a). In FIG. 3(b), region (3) indicates the thermal oxide film which is formed thinly after forming the wall-type body, and it is properly determined in a thickness between 0.5 nm and 50 nm. In a practical fabrication process, the thick field dielectric film of region (5) is formed after forming the dielectric film of region (3). Moreover, after forming the dielectric film of region (3), the silicon nitride film is properly formed with a thickness between 1 nm and 100 nm, and thereby removing the defect which can occur after forming the field dielectric film of region (5) or effectively exposing the sides of the region which will be recessed in the future. These steps can be used in a practical fabrication process.

Figure 4:
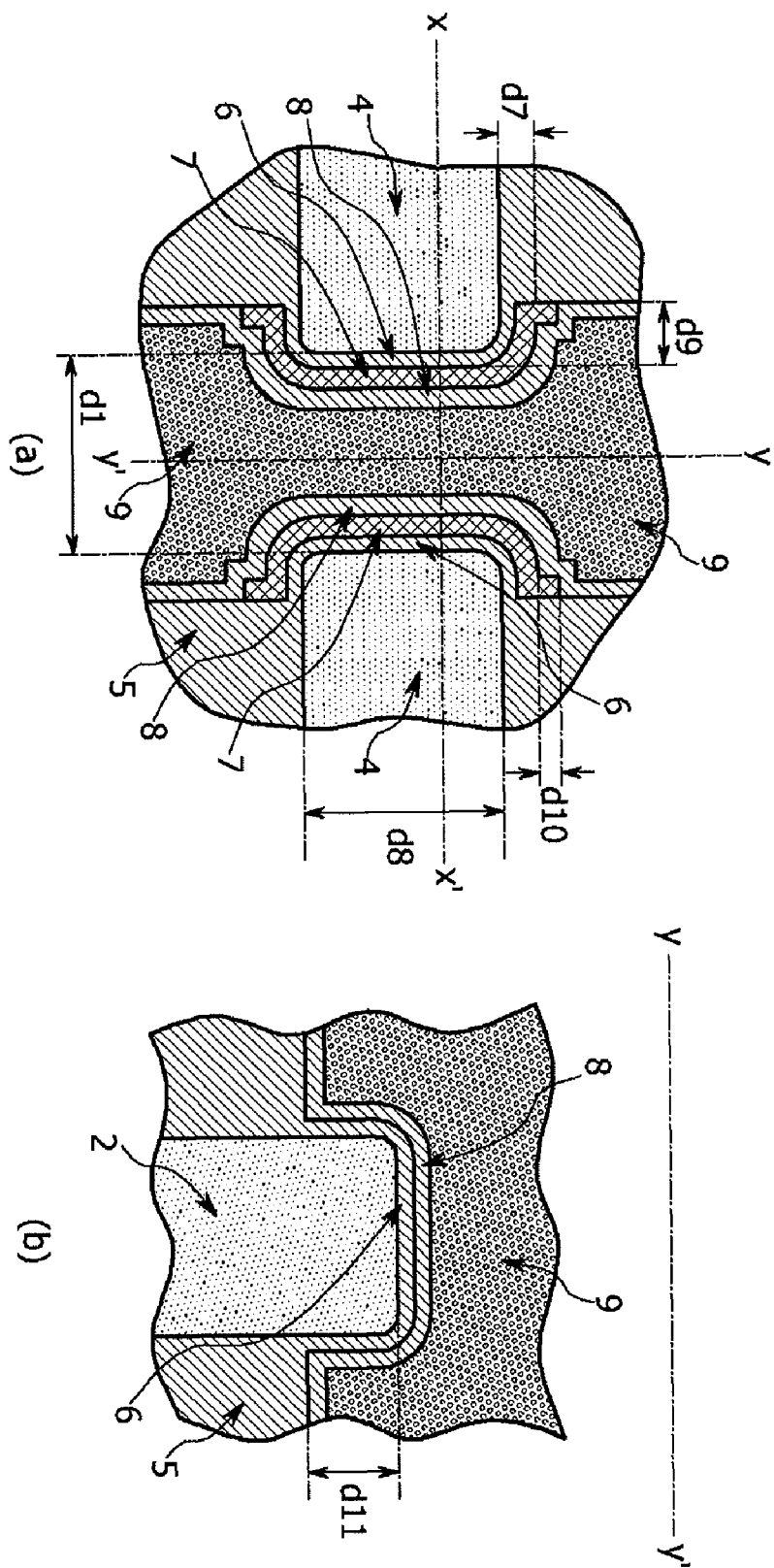
FIG. 4(a) shows a top view of the device in which the corners between the surface and the sidewalls of the recessed area are formed to be round in the device structure according to the present invention.
FIG. 4(b) shows a y-y' cross-sectional view cutting along with the control electrode.

The top view of the device structure in accordance with the present invention is more precisely shown in FIG. 4(a), and the cross-section cut along with y-y' in the top view is shown in FIG. 4(b). In FIG. 4(a), the cross-section cut along with x-x' was shown in FIG. 3(a). In case that the channel of a device is formed in the recessed region, the channel controllability of the control electrode for a device is decreased as compared to a planer channel device structure, thereby degrading the on-off characteristic (or sub-threshold swing) under the same substrate doping density. If so, the current of on-state reduces and the current of off-state increases. Therefore, if the control electrode of region (9) is formed with the sides of the recessed surface as being exposed, then the channel controllability of the control electrode is improved, and thus the characteristic of a device can be improved. As an embodiment of the structure, the on-off characteristic is improved, as compared to the existing straightforward recessed channel structure, by not making the storage node of region (7) formed as shown in FIG. 4(b), but making the control electrode of region (9) formed in the floor surface and its both sides of the recessed region, where channels are made. In FIG. 4(b), d11 corresponds to the length of the sides exposed after recess, and the value of the length is properly determined in a range between 1 nm and 50 nm. Just, 0 of d11 means that the lateral channel is not formed.

The d7 indicated in FIG. 4(a) the thickness that sums the thickness of the tunneling dielectric film of region (6) being formed in the sides of recessed region and the thickness of the storage node of region (7). The d8 indicates the width of the wall-type body of region (2), and it can be properly determined in a range between 2 nm and 200 nm. The d9 indicates, the same thing as d9 shown before in FIG. 3(b), the length of the storage node of region (7) covering the sides of the recessed region. The d10 is the length which is determined so that the storage node of region (7) could be expanded to the extent that the sides of the recessed region can be sufficiently covered in a single cell. In a fabricating process, the length of d10 can be nearly removed by introducing a proper self-alignment technique. In some cases, the storage node of region (7) can be formed to be connected between cells toward the longitudinal direction of the control electrode of region (9). In FIGS. 4(a) and (b), the edge existing in between the surface and the sides of the recessed region formed on the wall-type body of region (2) is formed as round shape, so that the formation of parasitic channel can be suppressed as much as possible. In FIG. 3(b), the edge is indicated as a right angle for the convenience of the structure in 3-dimensional drawings, and preferably it is necessary to make the edge round as shown in FIG. 4(a).

Figure 5:
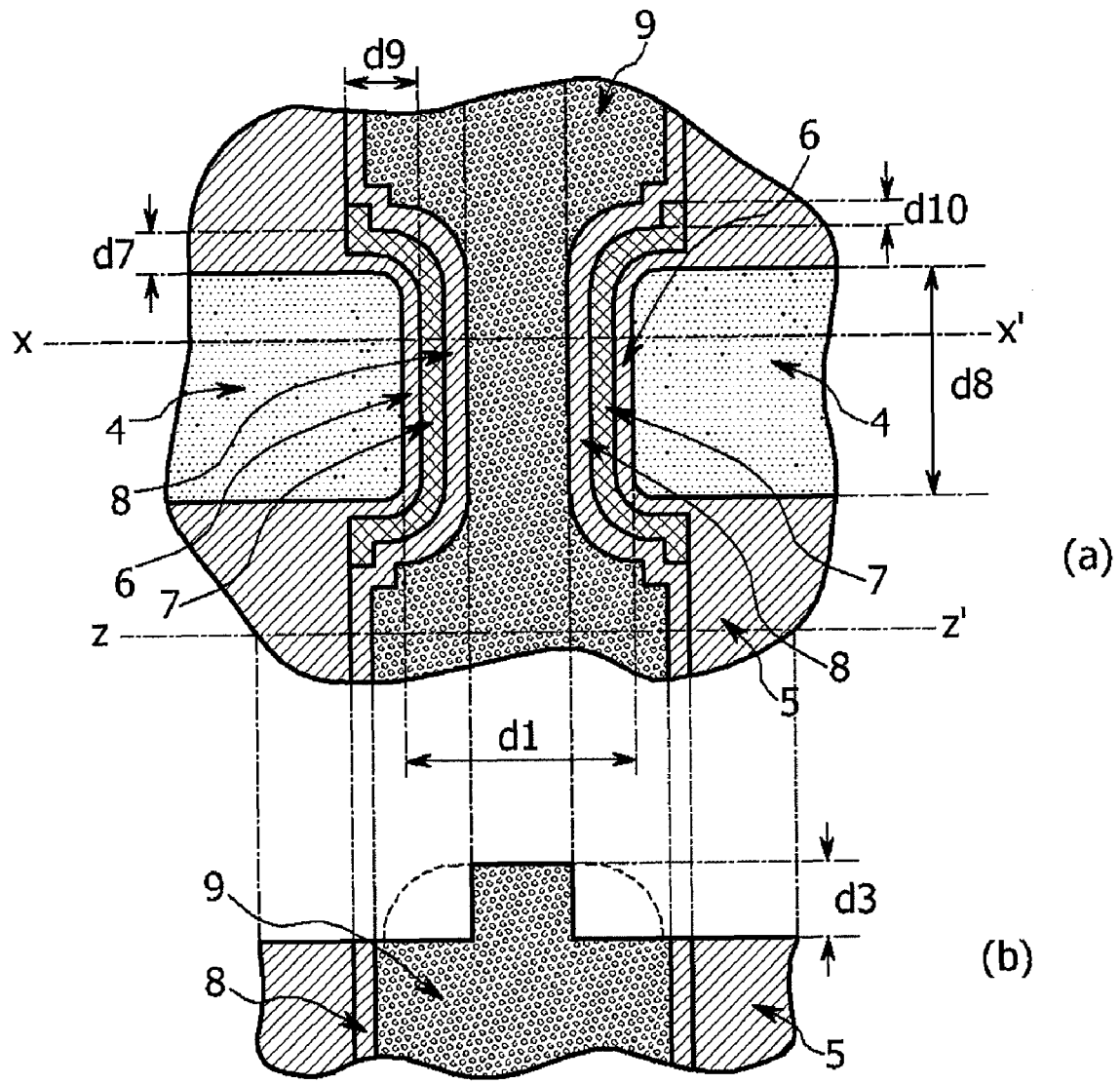
FIG. 5(a) shows a top view of the device in which the corners between the surface and the sidewalls of the recessed area are formed to be round in the device structure according to the present invention.
FIG. 5(b) shows a z-z' cross-sectional view cutting across the control electrode in the field nitride region.

FIG. 5 is a drawing for illustrating a simple method which makes the charge storage node of region (7) shown in FIG. 5(a) formed only around a cell while reducing a piece of mask by applying a self alignment technique as an example. That is, it is shown that so-called self alignment technique can nearly remove d10 which is the length of the expanded charge storage node, corresponding to the margin shown in FIG. 5(a), without additional mask. FIG. 5(b) is prepared for briefly illustrating the technique. FIG. 5(b) approximately shows the upper section of the cross-sectional view cutting across the control electrode in the field oxide film of region (5) after forming the control electrode of region (9). Of course, the cross-sectional view cutting along with x-x' in FIG. 5(b) is as shown in FIG. 3(a). The spacer indicated with dotted line in FIG. 5(b) can be formed by using the height of d3 protruded upward the wall-type body of region (2). And the charge storage node of region (7) exposed after forming the spacer is selectively etched, and thus the charge storage node can be formed only around a cell without using even a piece of additional mask by nearly removing d10.

Figure 6:
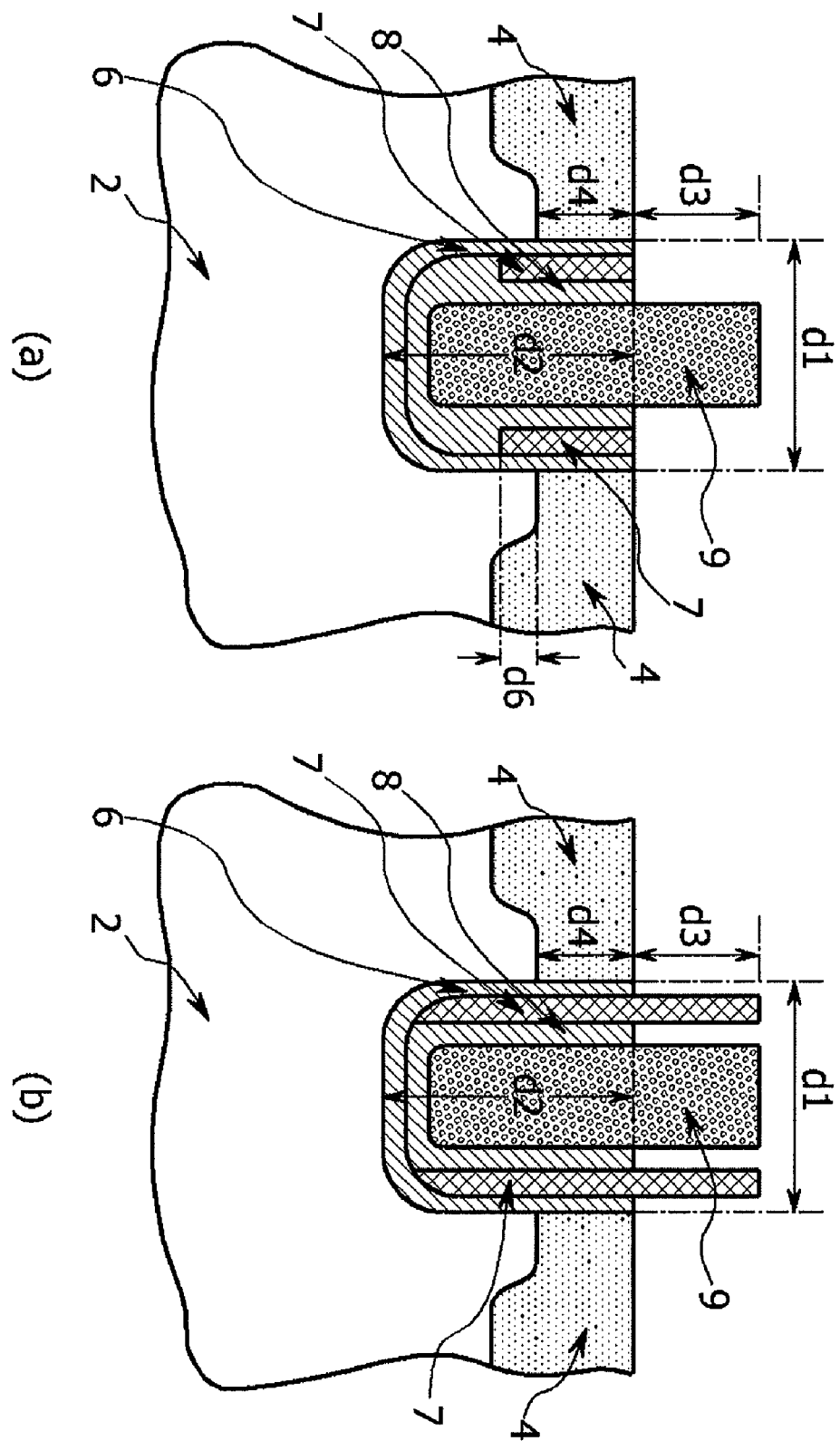
FIG. 6(a) and FIG. 6(b) show cross-sectional views for the structures of flash memory device according to a modified embodiment of the present invention.

FIGS. 6(a) and (b) are a little modified structures for FIG. 3(a) which is the structure in accordance with the present invention, which only change the structure of the charge storage node of region (7). FIG. 6(a) is formed by nearly removing d5 in FIG. 3(a). As the charge storage node (or d6 of FIG. 3(a)) is enlarged from the source/drain junction near to the floor of the recessed region and also from the wall-type body surface to the height of d3 corresponding to the height of the protruded control electrode, the structure as shown in FIG. 6(b) can be obtained. These formations can be implemented through a little modification in a fabrication process.

Figure 7:
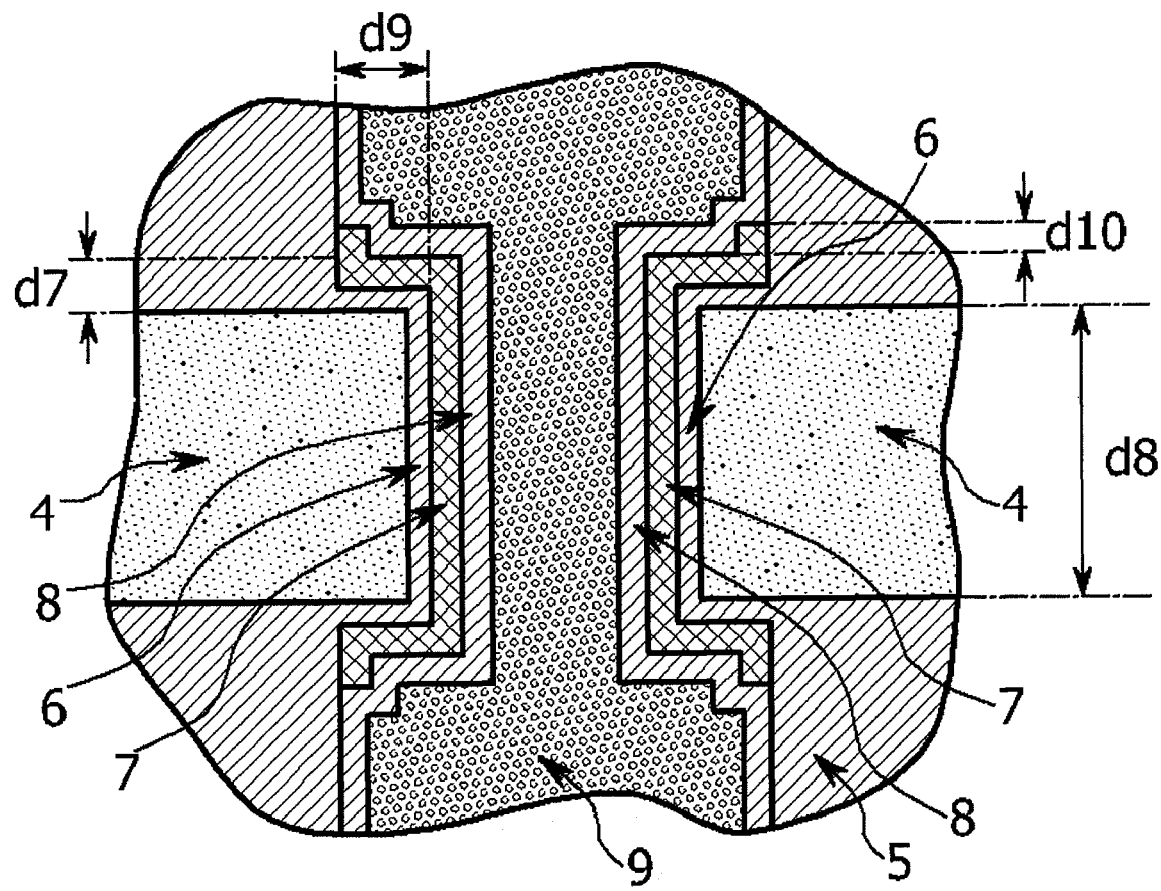
FIG. 7 shows a top view of the device formed as an embodiment of the device structure in accordance with the present invention.

While FIG. 7 is basically similar to the top view shown in FIG. 4(a), there is a difference only in that the edge between the surface and the sides of the recessed region is maintained with nearly right angle. In this structure, as is the self alignment technique illustrated in FIG. 5, the charge storage node of region (7) can be formed in only around a cell without additional mask.

Figure 8:
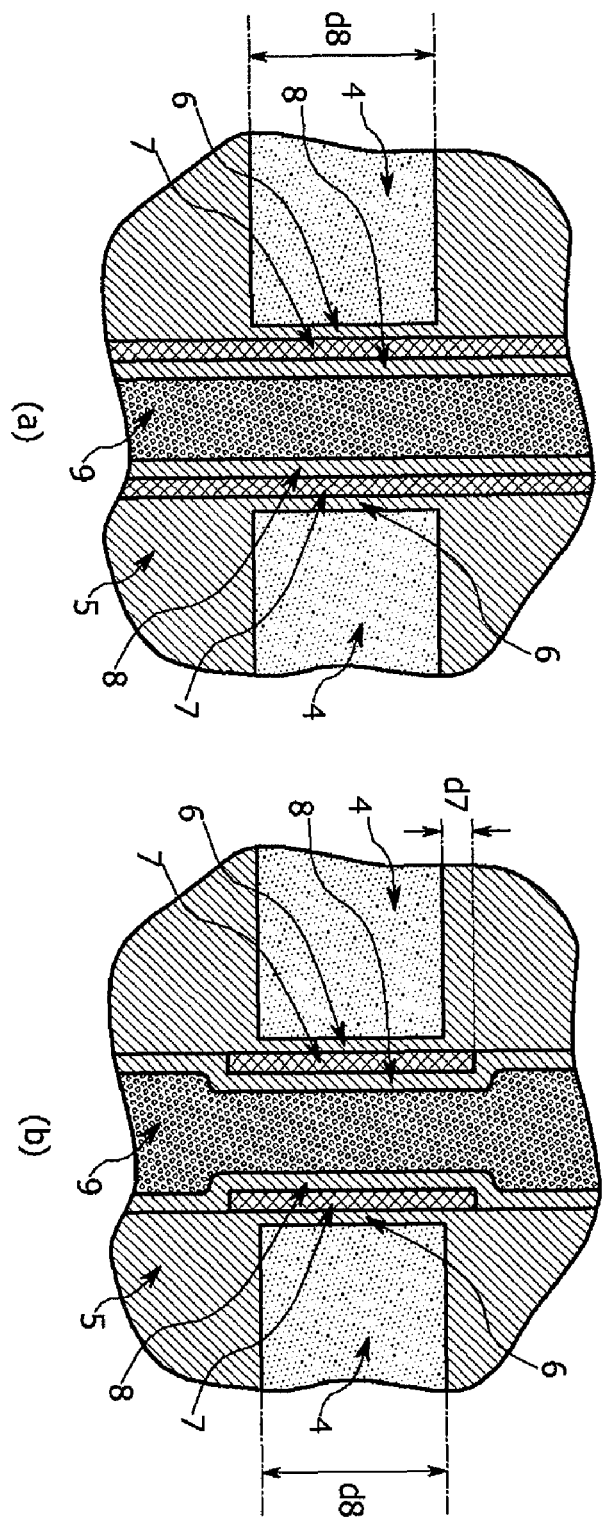
FIG. 8(a) and FIG. 8(b) show top views of a modified device structure in accordance with the present invention.

FIG. 8 shows the top view of the structure modified in accordance with the present invention. FIG. 8(a) is formed by nearly removing d9 (i.e., the length which the charge storage node of region (7) covers a part of the sides of the recessed region) and making the charge storage node of region (7) connected in between cells along with the control electrode. In this case, conductive charge storage material cannot be used because the charge storage nodes are interconnected between cells. However, the dielectric material capable of storing electric charges or a plurality of nano-scale dots can be used for the charge storage node. While FIG. 8(a) is basically similar to FIG. 8(b), the charge storage node is formed to be unconnected in between cells with an additional mask in order to limit the charge storage node of region (7) only around a cell. Therefore, in this case, conductive and dielectric materials, and various materials of nano-scale dots can be utilized for the material of a storage node.

Figure 9:
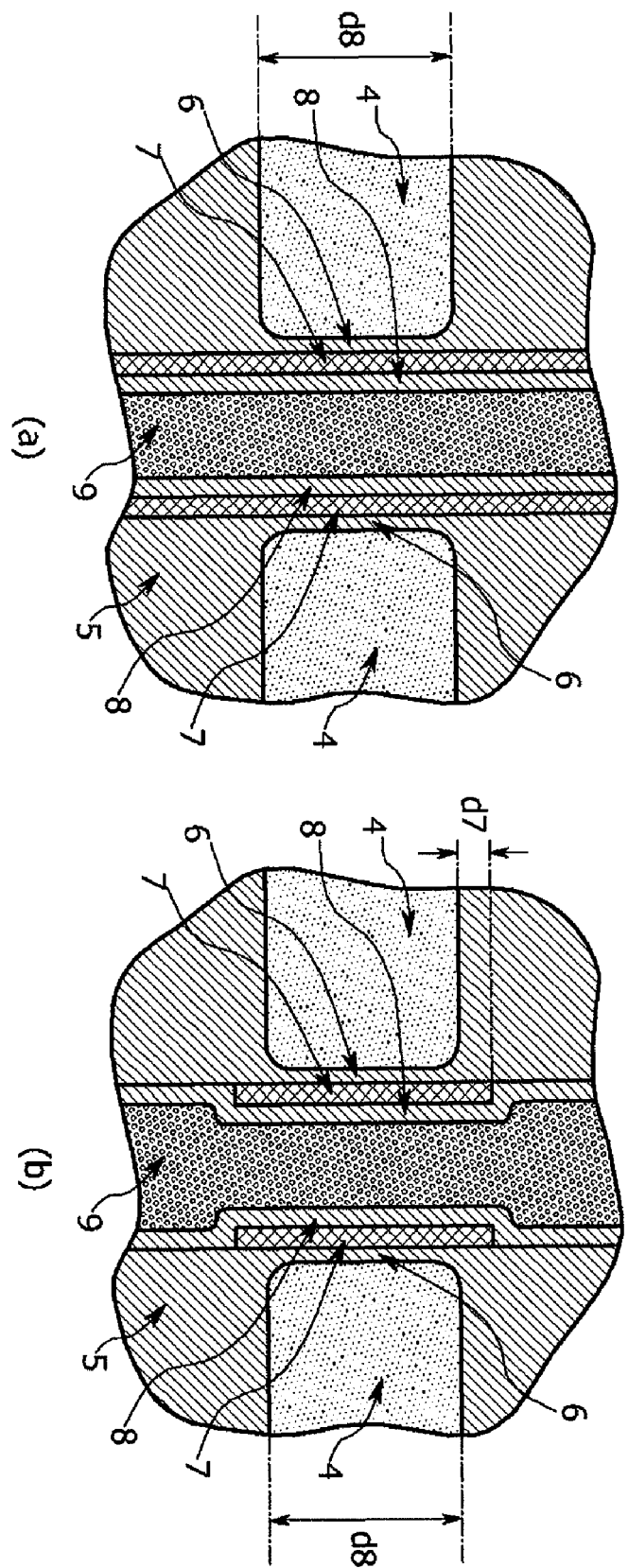
FIG. 9(a) and FIG. 9(b) show top views of a modified device structure in accordance with the present invention.

FIGS. 9(a) and (b) are basically the same as FIGS. 8(a) and (b), except for a difference in which the edge between the surface and the sides of the recessed region is made of round.

Figure 10:
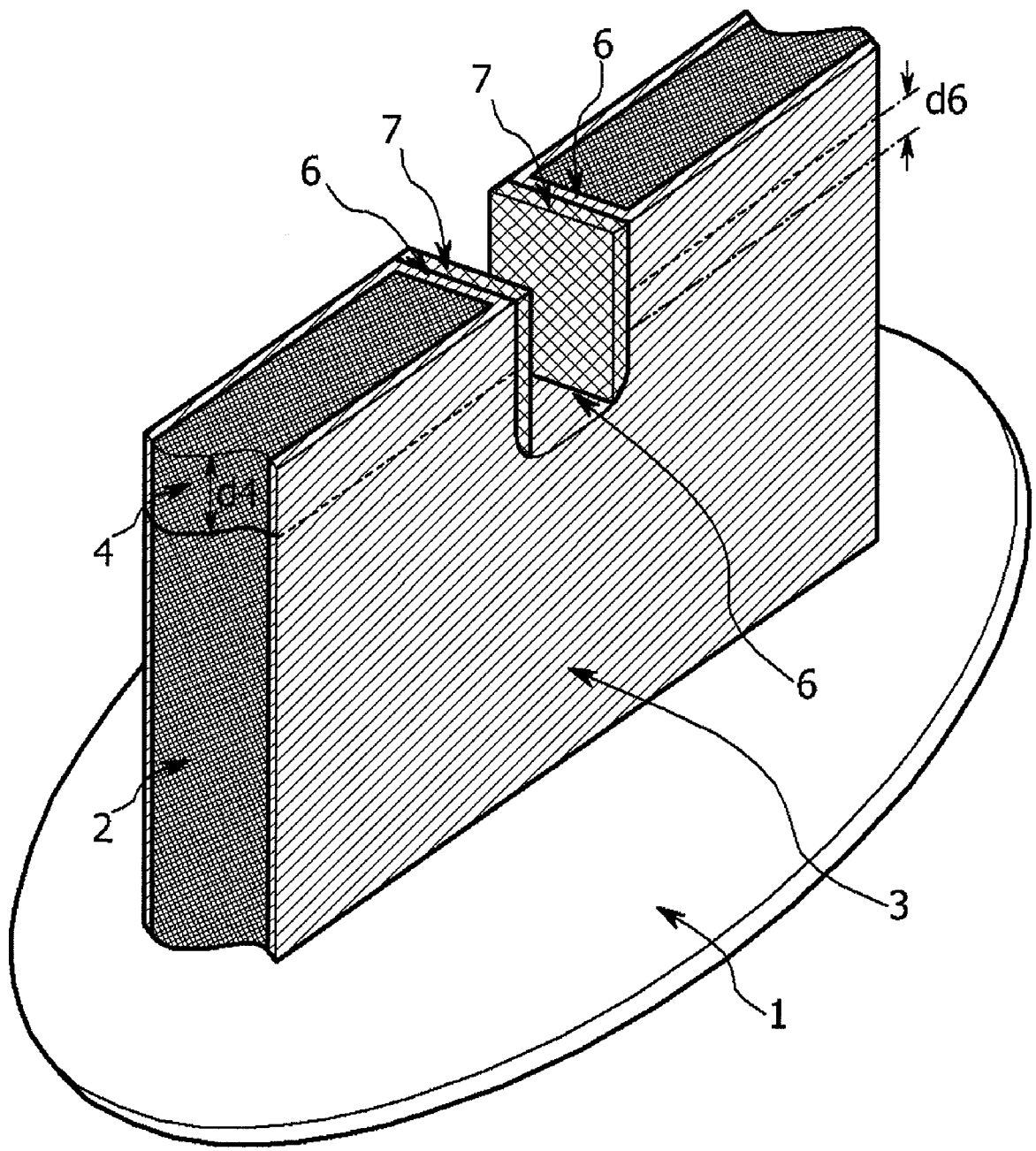
FIG. 10-FIG. 14 show various types of three-dimensional perspective views for apparently showing the principal parts near the body including the steps before the control dielectric film is formed in the modified device structure in accordance with the present invention.

FIG. 10 is a 3-dimensional perspective view showing the structure just after the charge storage node of region (7) is formed. In order to more clearly show the modified structure in accordance with the present invention, it shows only around the wall-type body of region (2) and omits the field dielectric film of region (5) in order to more clearly show the recessed region. The charge storage node of region (7) is formed only in the sides of the recessed region. That is, the storage node is formed from the surface of the wall-type body of region (2) up to nearby the recessed floor.

Figure 11:
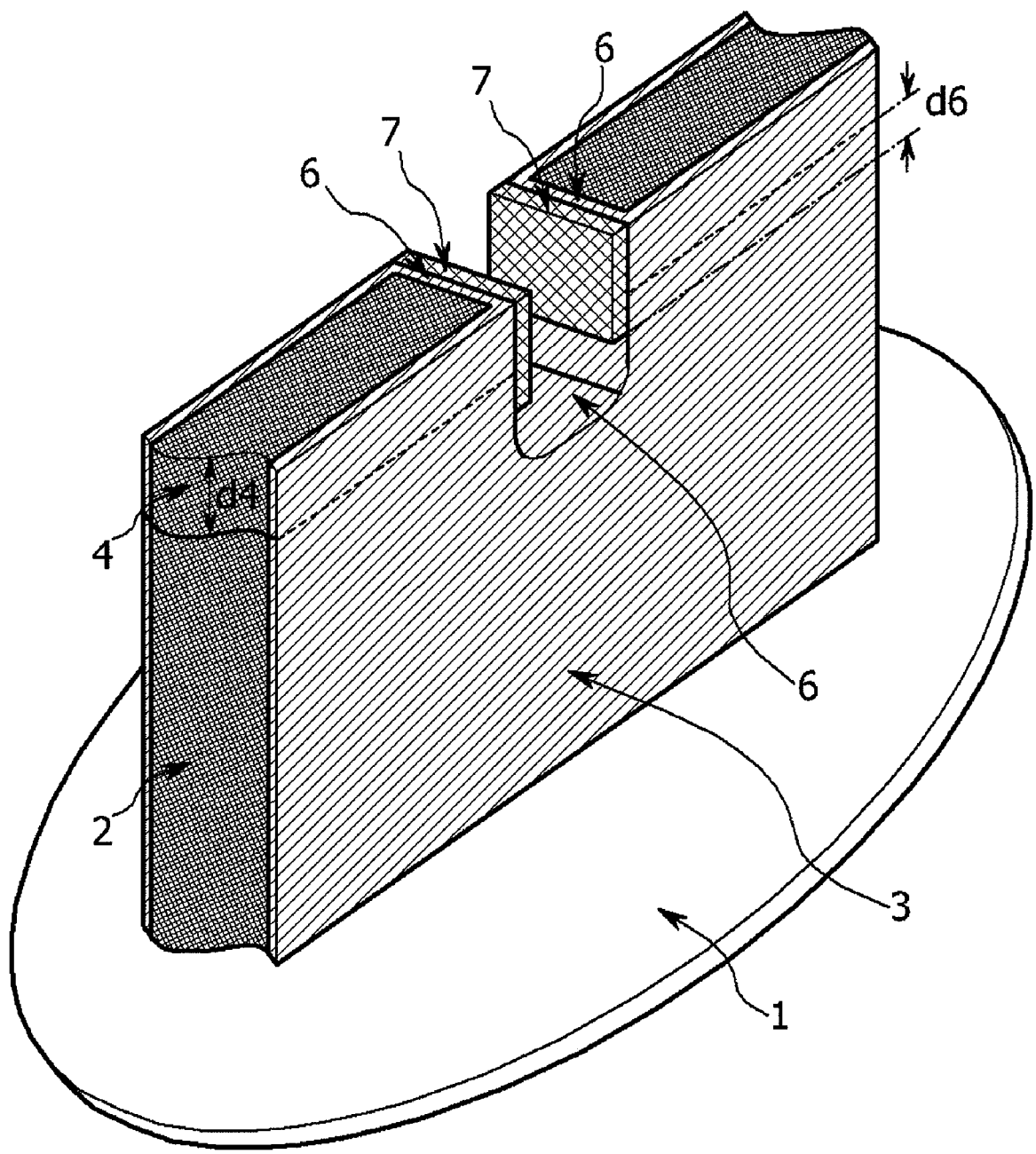

FIG. 11 is a 3-dimensional perspective view prepared for clearly showing the structural characteristic of the charge storage node, in a similar way shown in FIG. 10. The charge storage node of region (7) is formed only in a part of the sides of the recessed region, which ranges up to a predetermined depth of the recessed region from the wall-type body surface inside the recessed region.

Figure 12:
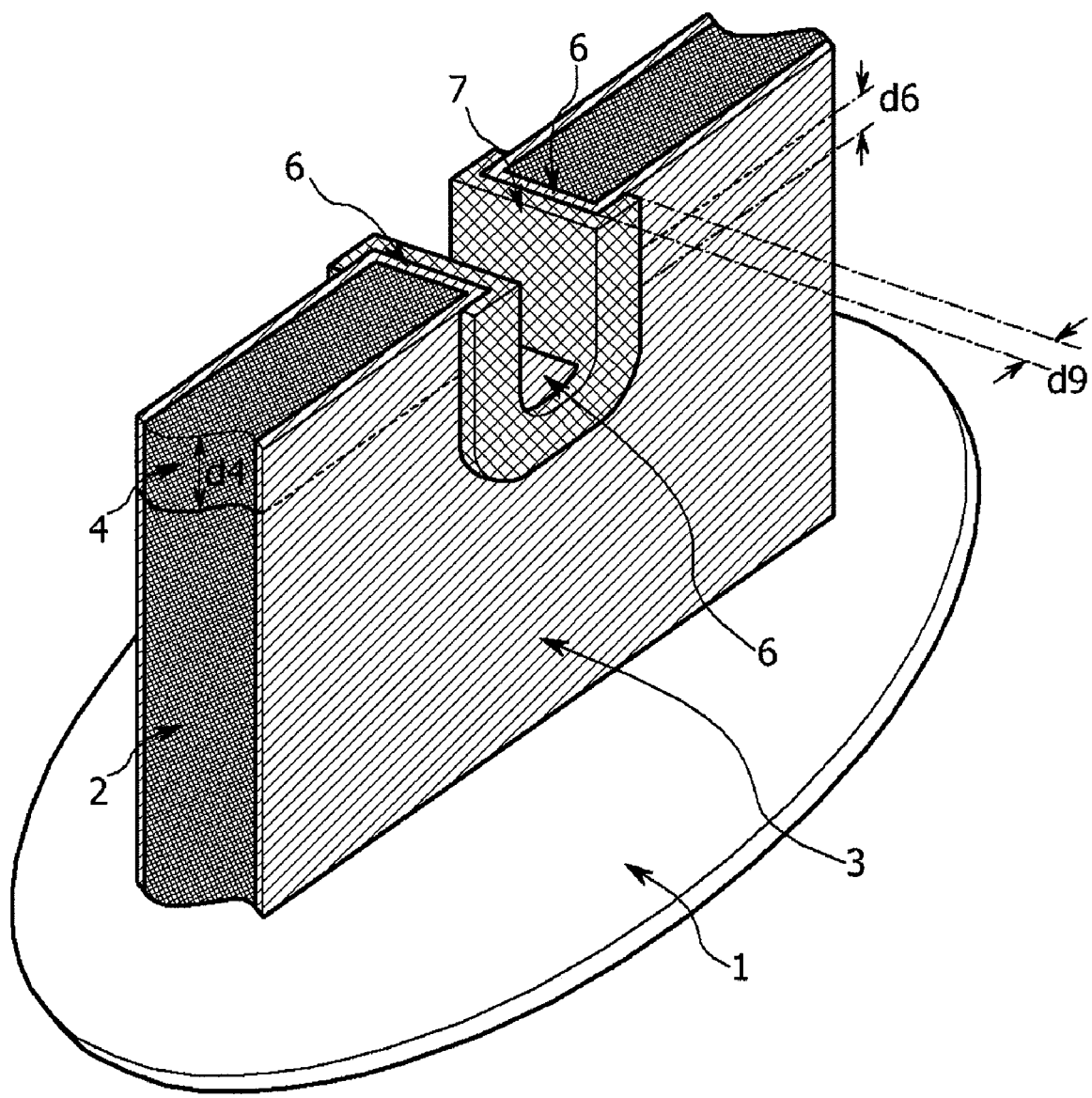

FIG. 12 is a 3-dimensional perspective view prepared for more clearly showing the structural characteristic of the charge storage node, in a similar way shown in FIG. 10. The charge storage node is formed, along with edge, to cover the inner sides of the recessed region except for around the floor inside the recessed region and a part of inside walls of the recess region contacting with the recessed region. The length covering the outer sides of the recessed region is indicated as d9.

Figure 13:
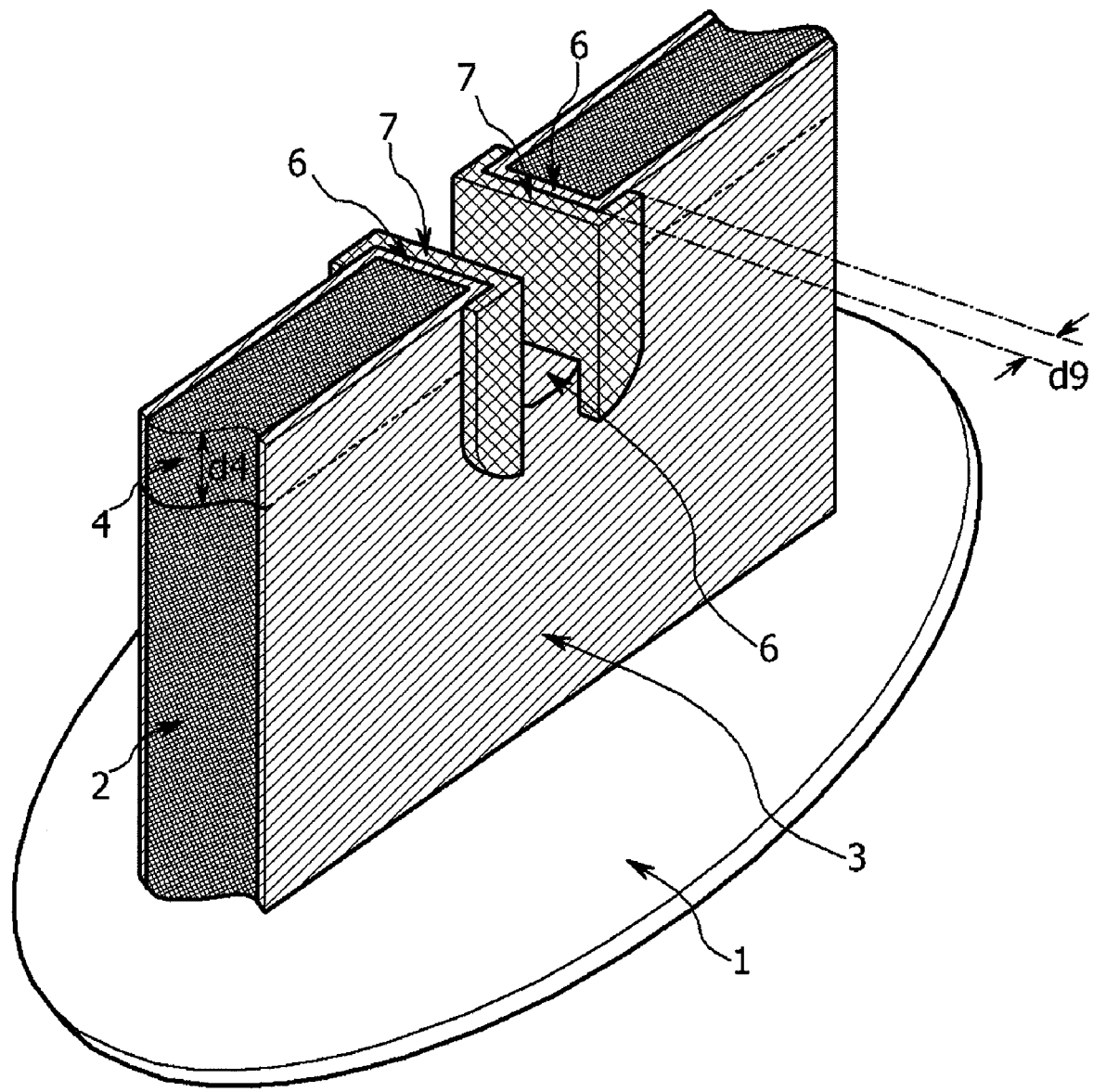

FIG. 13 is a 3-dimensional perspective view prepared for clearly showing the structural characteristic of the charge storage node, in a similar way shown in FIG. 10. The charge storage node of region (7) is formed to cover, only to the vertical direction, inside walls inside the recessed region and a part of outside walls of the recess region contacting with the recessed region. The length covering outside walls of the wall-type body of the recessed region (2) is indicated as d9. In the floor of the recessed region and the sides contacting with the floor, the charge storage node of region (7) is not formed.

Figure 14:
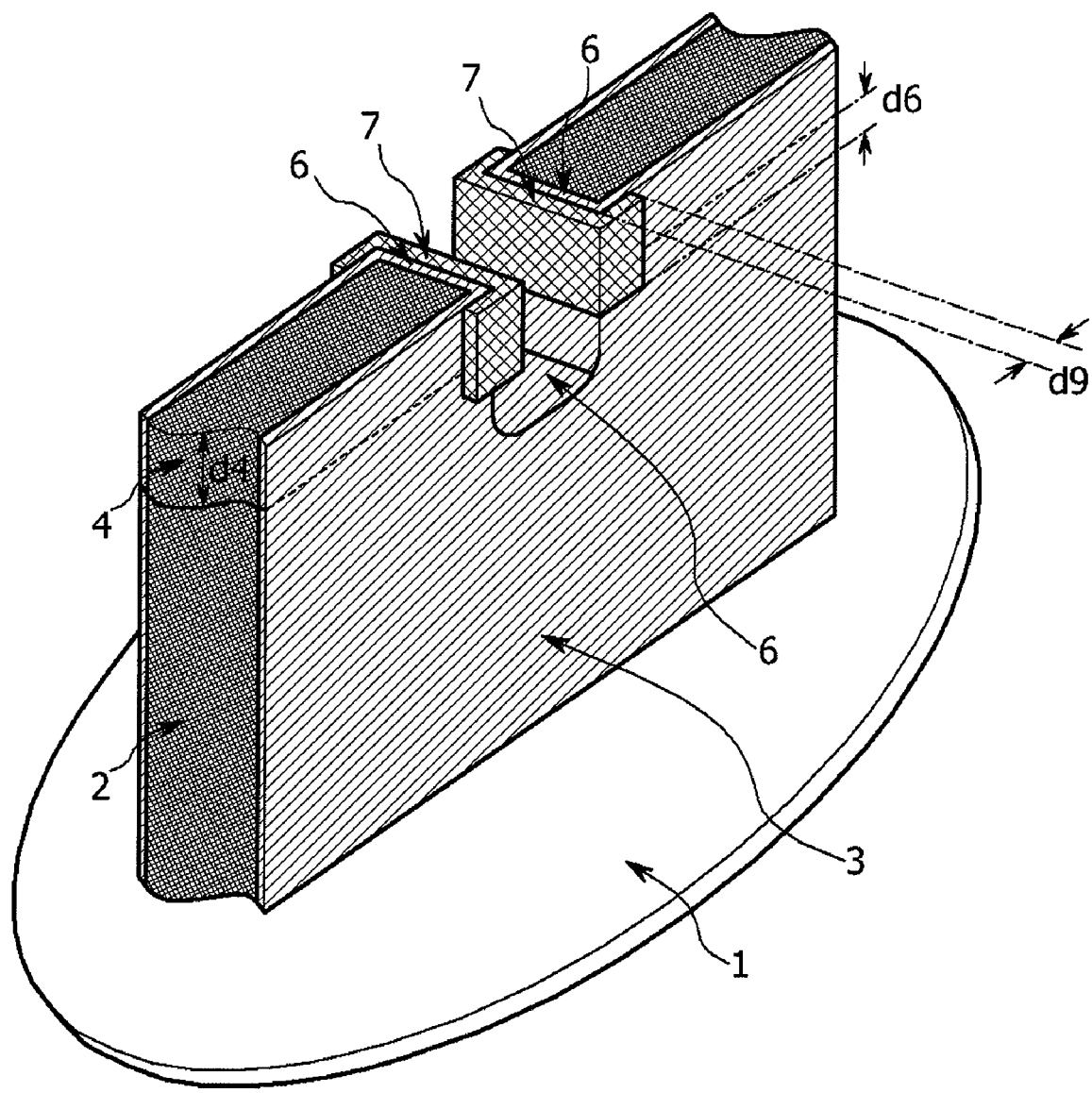

FIG. 14 is a 3-dimensional perspective view prepared for clearly showing the structural characteristic of the charge storage node, in a similar way shown in FIG. 10. While it is similar to FIG. 3(a) in accordance with the present invention, it is a 3-dimensional perspective view for the device structure which the distance (i.e., corresponding to d5 of FIG. 3(b)) between the wall-type body surface and the charge storage node is nearly zero (0).

Figure 15:
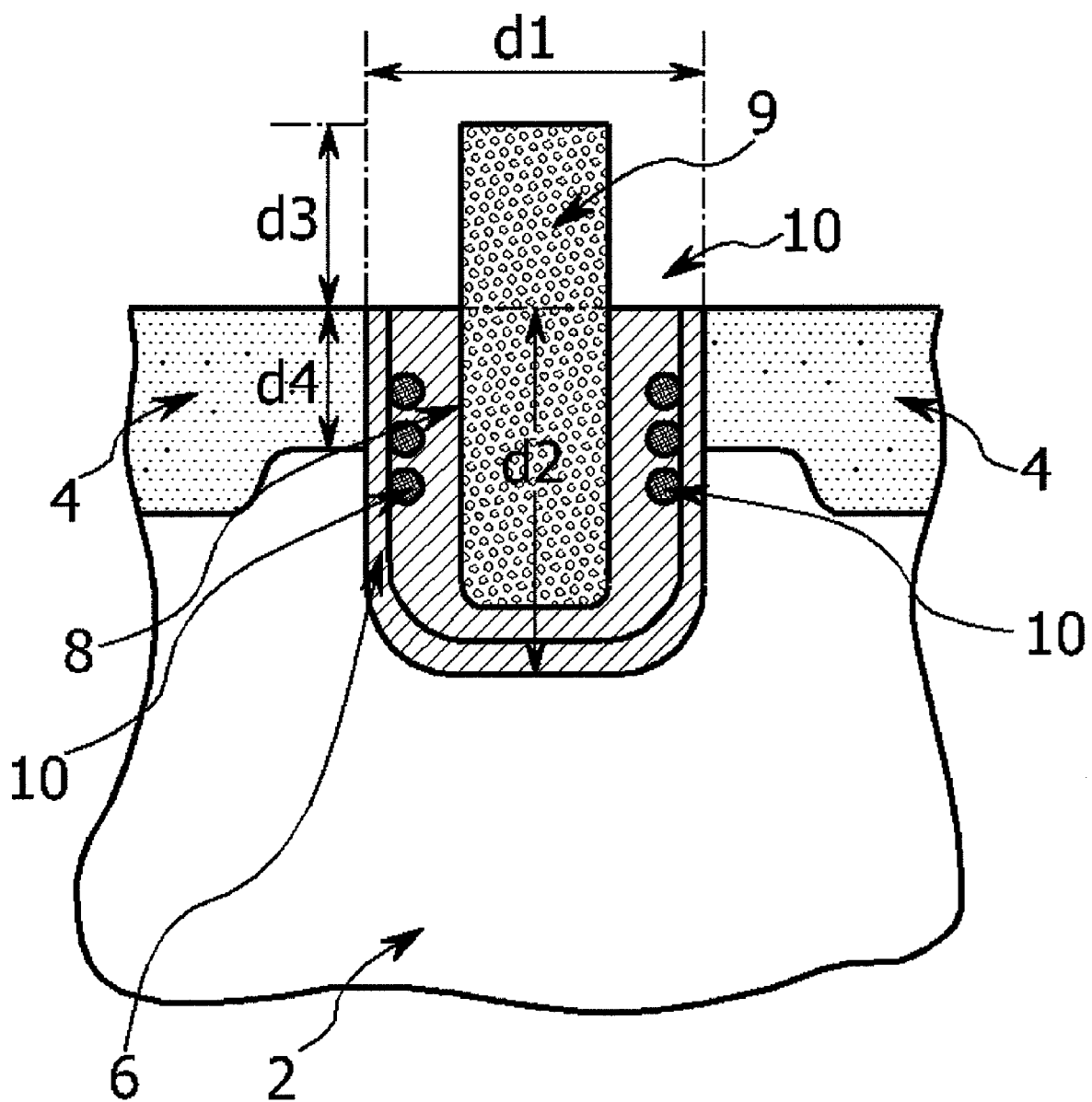
FIG. 15 is a cross-sectional view showing an embodiment in which the storage node is formed with nano-scale dots in the cross-sectional view for the device structure in accordance with the present invention.

FIG. 15 shows a cross-sectional view of the structure replacing the charge storage node of the structure shown in FIG. 3(a) (also explained in its detailed description) with nano-scale dots capable of storing charges. The dots of region (10) can be made of a material such as dielectric material, various kinds of metals, Si, Ge, SiGe, and various kinds of silicides, which are capable of storing electric charges.

Figure 16:
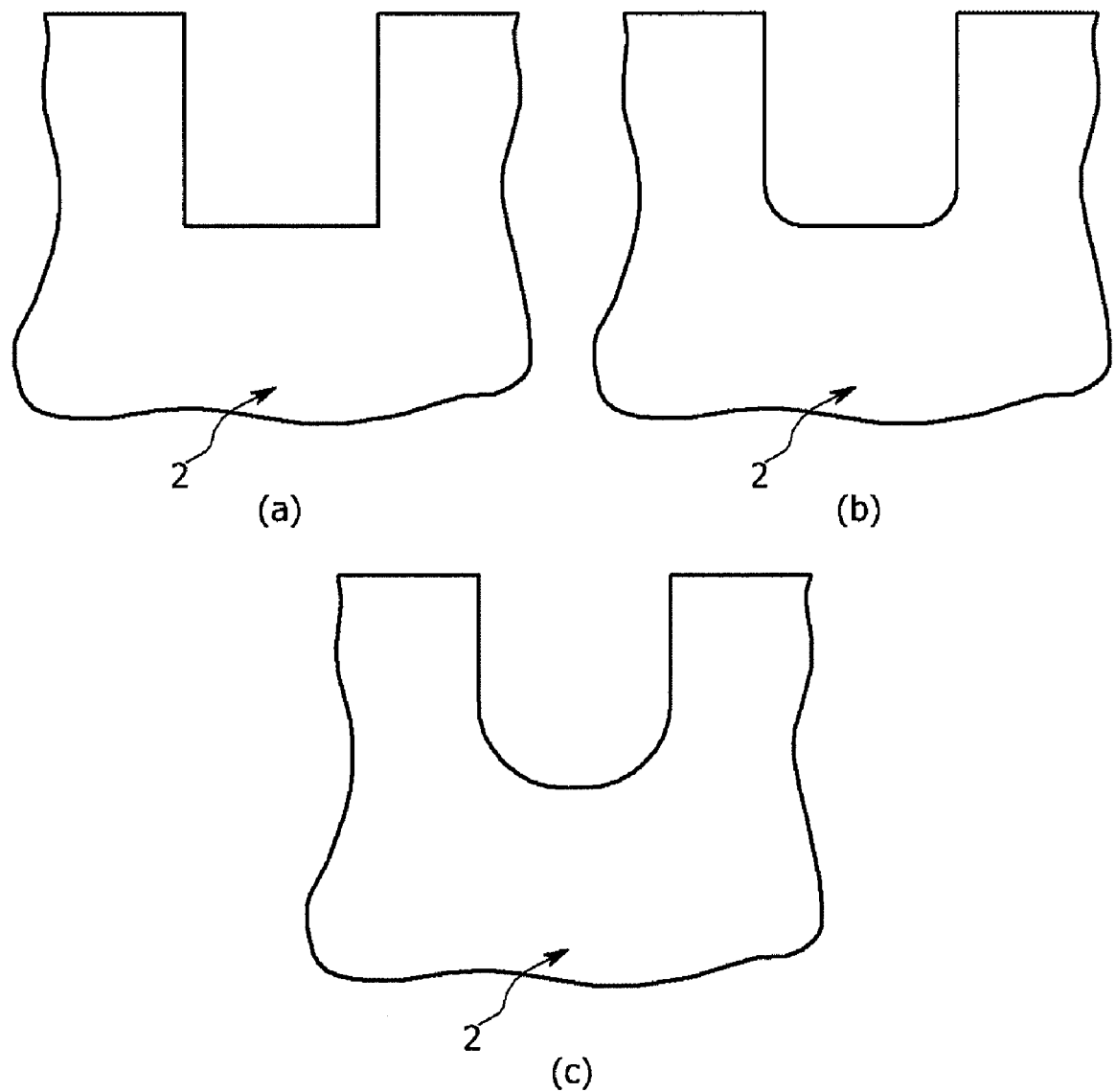
FIG. 16(a)-FIG. 16(c) are drawings showing profiles of various recessed regions formed on the body in the device structure in accordance with the present invention.

FIG. 16 shows three representative recess profiles for the recessed channel region in accordance with the present invention. In FIG. 15(a), since the corners around the floor of the recessed region are formed as a right angle, the problems (the sensitivity of the threshold voltage for substrate voltage shift is increased, and the non-uniformity of device characteristics is increased) are occurred. FIG. 15(b) intends to solve the problems associated with the electric field dispersion and the sensitivity increase of the threshold voltage occurred at the corner around the floor of the recessed region by making the corner shaped as round. Preferably, the corner problems mentioned can be reduced by making a semicircle shaped round profile as shown in FIG. 16(c).

Figure 17:
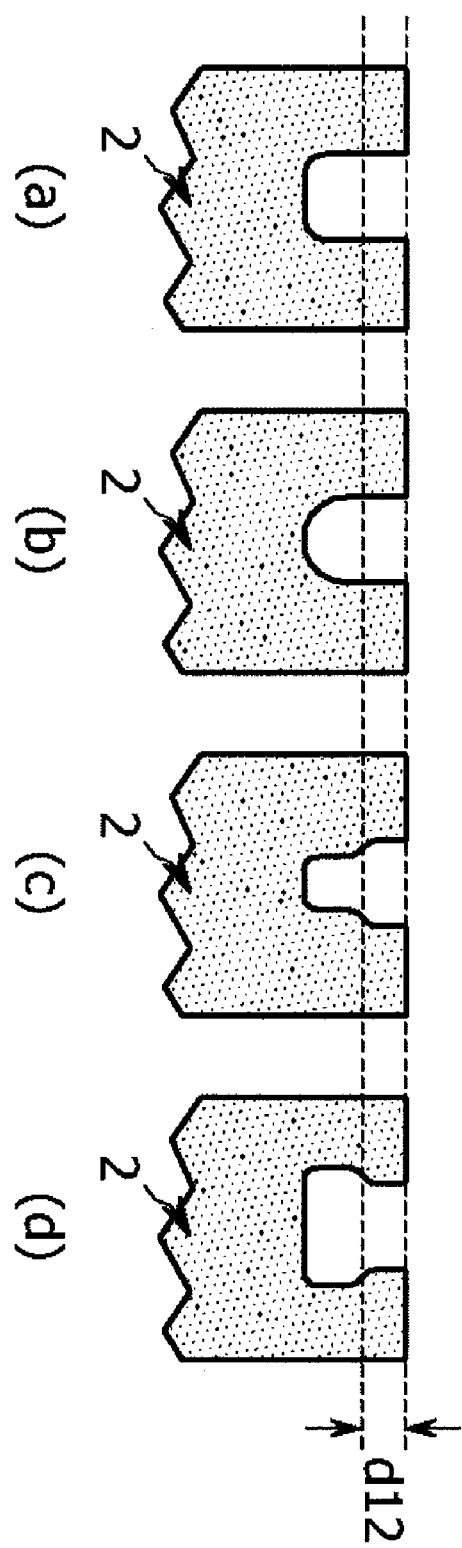
FIG. 17(a)-FIG. 17(d) are drawings showing the profiles of various recessed regions formed on the body in the device structure of the present invention, especially in the case that the recess is performed with 2 steps.

FIG. 17 shows a recess profile of the recessed channel region in accordance with the present invention. When one attempts to form the storage node of region (7) with smaller depth than the recess depth and only around the source/drain junction, in a similar way shown in FIG. 3(a), it is necessary to form the recess region with 2-step etches. FIGS. 17(a) and (b) show the case that although the etching is performed in 2-step, there is little change of the recessed width toward recess depth direction. Both of form the corners around the recessed floor to be round. Just in case of FIG. 17(b), the vicinity of the bottom of the recessed region is formed into a semicircle shape. FIG. 17(c) is to form the recess width of the previous etching step 1 greater than the recess width of the next etching step 2. FIG. 17(d), on the contrary, is to form the recess width of the next etching step 2 greater than the recess width of the previous etching step 1. It is possible to apply each profile to the structure in accordance with the present invention.

Figure 18:
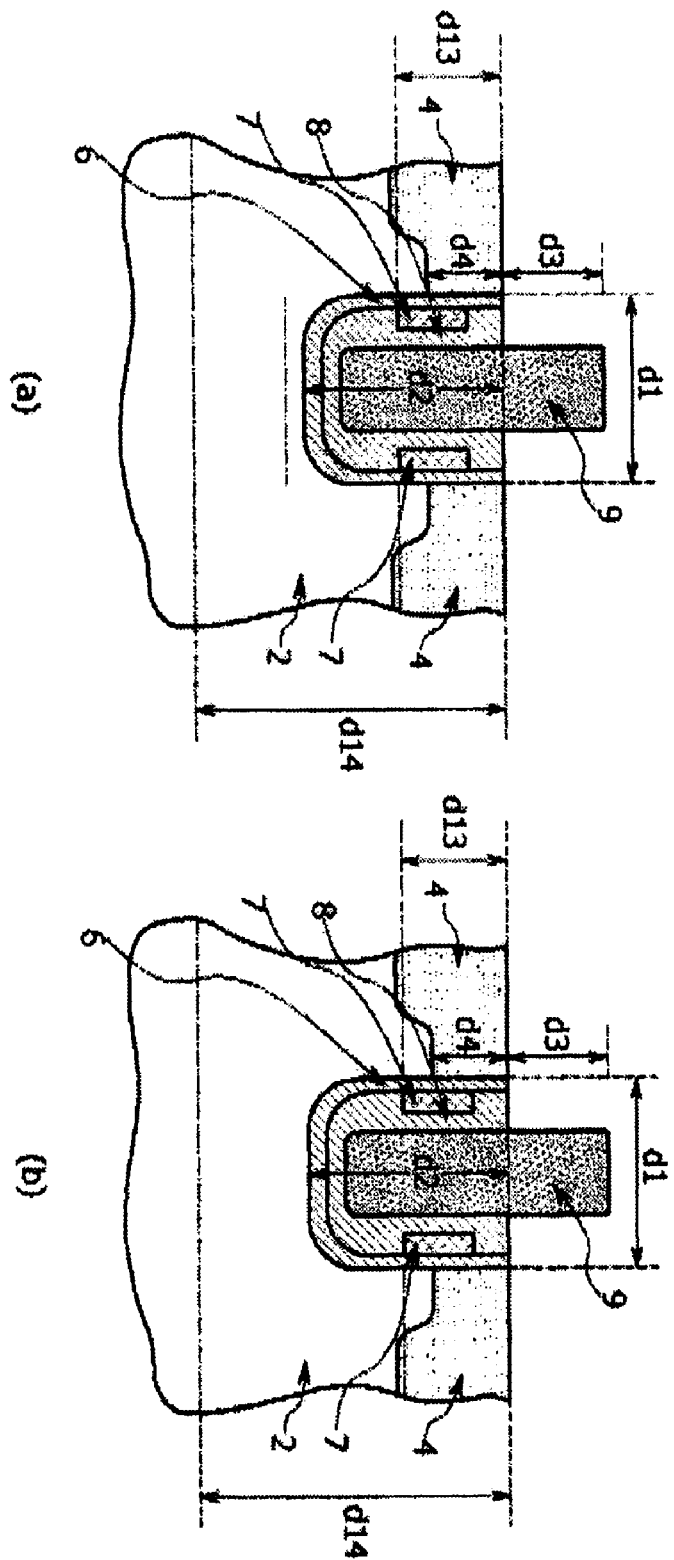
Figure 19:
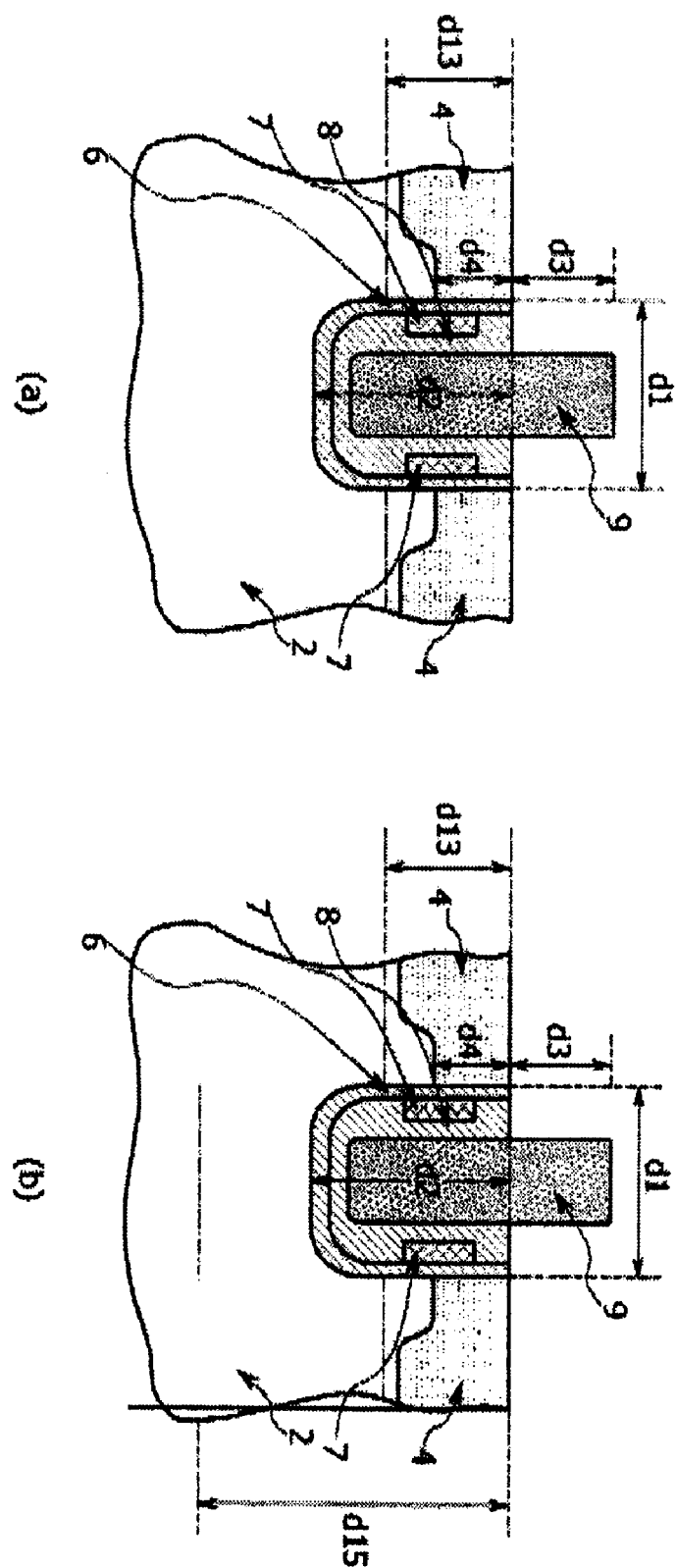
Figure 20:
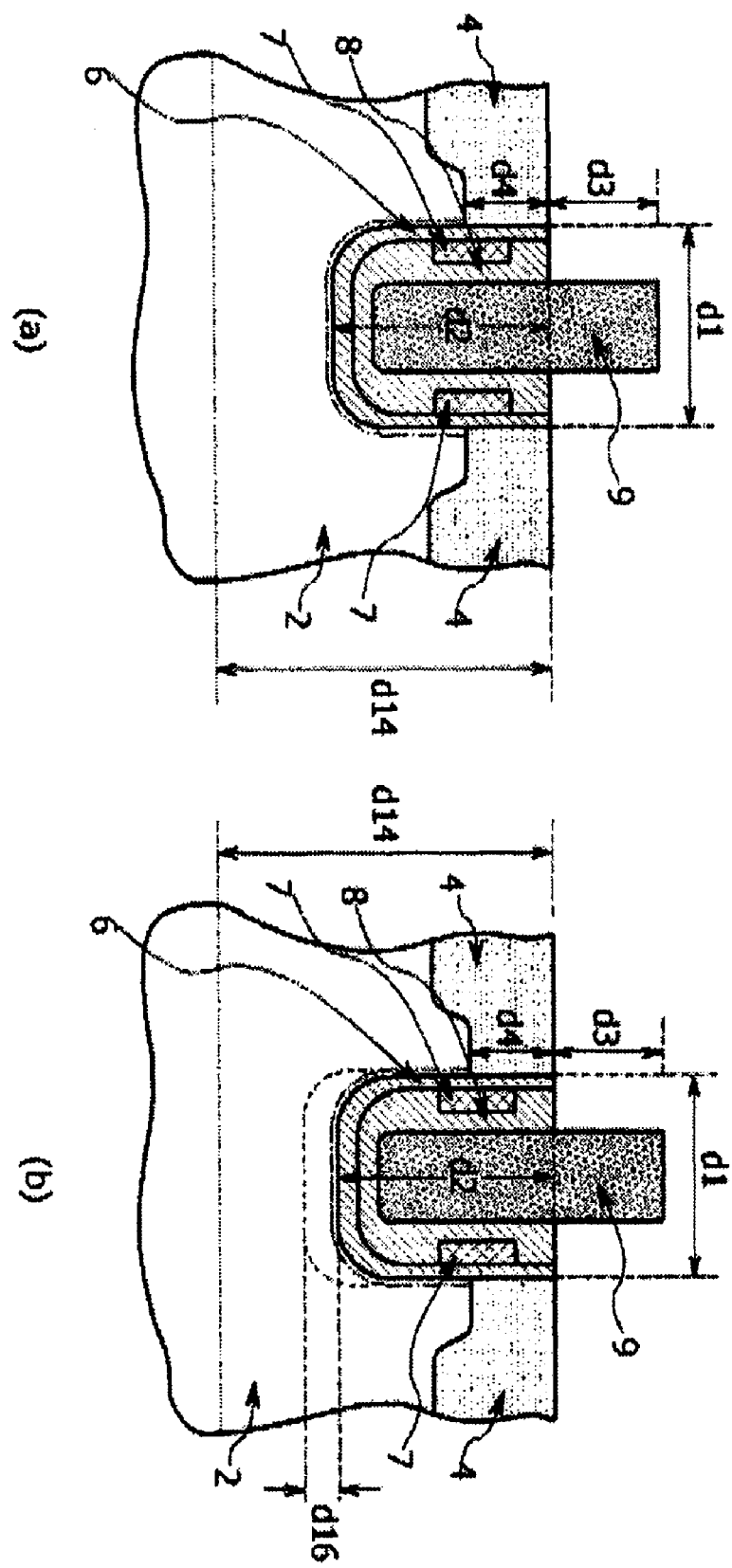

FIG. 18-FIG. 20 are prepared for showing the channel or body doping formed on the recess region in the device structure of the present invention as shown in FIG. 3(a). The doping plays very important role in the recessed channel structure. For showing the body doping, the range being doped and the position of peak concentration assuming Gaussian distribution are indicated with dot dash line.

FIG. 18(a) shows the case of adding 3 kinds of dopings in the uniform doped body. The range of the uniform body doping is determined with a suitable value between $10^{15}$ cm$^{-3}$ and $5 \times 10^{18}$ cm$^{-3}$. The doping is performed around the source/drain junction according to the $R_p$ (Projected Range) of the ion implantation, and the peak doping concentration is properly determined with a value between $10^{16}$ cm$^{-3}$ and $2 \times 10^{19}$ cm$^{-3}$. And $DR_p$ (standard deviation) is changed according to the energy and annealing conditions given in the ion implantation. The d13 indicates the distance formed the peak concentration of the body doping which is formed around the source/drain in the wall-type body surface of region (2). The doping profile by the ion implantation is usually expressed in the form of Gaussian function or similar functions. FIG. 8(a) shows the case that the doping is selectively performed only in the channel region under the floor of the recessed region. The threshold voltage of a device mainly depends on the doping level of the floor channel region including the corner around the floor of the recess region. The peak concentration range of the doping formed only under the recessed floor is determined between $10^{15}$ cm$^{-3}$ and $5 \times 10^{18}$ cm$^{-3}$. The d14 shown in FIGS. 18(a) and (b) indicates that the doping concentration is made to be raised in the lower region than the floor of the recessed region in the wall-type body surface of region (2), the peak concentration value is determined between $10^{15}$ cm$^{-3}$ and $2 \times 10^{19}$ cm$^{-3}$, and the depth of the position having peak concentration from the body surface is properly determined in the value less than 500 nm.

FIG. 18(b) is the same case as FIG. 18(a), excepting for the channel doping formed under the floor of the recessed region in FIG. 18(a). With the structure in accordance with the present invention, highly integrated device which can store 1-bit, 2-bit, or more than 2-bit in a cell can be implemented. So-called channel hot carrier can be generated by adjusting the bias supplied to the control electrode, source, and drain. And the carrier is stored in the charge storage node of region (7) formed near the source or drain junction according to the given bias condition. Since each 1-bit can be respectively stored around the source/drain, 2-bit/cell can be implemented. Therefore, Preferably, the threshold voltage is determined by the channel in the vicinity of the source/drain junction rather than the channel in the vicinity of the floor of the recessed region. The threshold voltage is mainly determined by the channel doping, and thus it is very important to properly design the doping profile according to the position of the channel formed in the recessed region. In FIG. 18, the body doping formed deeply under the recessed region, in some cases, can coincide with what increases the impurity concentration in the vicinity of the field dielectric film of region (5). It can cause the threshold voltage of the field oxide region to be increased.

FIG. 19(a) shows the case that the impurity is injected so as to form $R_p$ near the source/drain junction depth from the wall-type body surface of region (2). And it also shows that the channel doping is not performed in the vicinity of the recessed floor. In this case, the threshold voltage is mainly determined by the channel doping near the source/drain junction. FIG. 19(b) shows that the selective doping is performed deeply under the floor of the recessed region in the channel doping profile of FIG. 19(a). As described in FIG. 18, through maintaining the channel doping profile to be high in the vicinity of the source/drain junction, and the channel doping concentration to be lower as going down near the floor of the recess region, as mentioned, it is desirable for the threshold voltage to be determined by the channel doping concentration in the vicinity of the source/drain junction. In FIG. 19(b), since the doping formed in the channel under the floor of the recessed channel is deeply formed, it cannot affect a big influence on the threshold voltage of the channel near the floor of the recess channel, and it can contribute to suppress the punchthrough which is possible to be in between the source/drain. The distance from the wall-type body surface of region (2) to the position having the selectively doped peak concentration can be properly determined in the value less than 500 nm, and the value of the peak concentration is determined between $10^{15}$ cm$^{-3}$ and $2\times10^{19}$ cm$^{-3}$.

FIG. 20 shows the channel doping with the surface (including sides and the floor surface) of the recessed region as a center position. Since in the case of FIG. 20(a) the doping profiles formed on the surface of the recessed sidewalls and the floor surface are similar, the threshold voltage is highest at the channel near the recessed floor, and the overall threshold voltage of a device is determined by the threshold voltage. There exist corners formed as round near the recessed floor, and in these kinds of corner regions, the electric field coming from the control electrode of region (9) spreads to the channel region, thus the threshold voltage is increased. Likewise, the peak concentration of the body doped along with the surface of the recessed region is determined between $10^{16}$ cm$^{-3}$ and $1\times10^{19}$ cm$^{-3}$. A proper method for implementing this kind of profile is to apply plasma immersion doping. In FIG. 19(a), it is also possible to make the threshold voltage of a device mainly determined by the channel doping near the source/drain, and it is to graft the method raising the channel doping near the source/drain junction introduced in FIG. 19(a) to FIG. 20(a).

FIG. 20(b) shows that the impurity type opposite to the channel doping type is doped, as indicated with dashed line, to order to reduce the threshold voltage near the recessed channel floor. In this way, since the threshold voltage is adjusted by the channel doping concentration or the profile formed on the sidewalls of the recessed region, the threshold voltage of a device can be adjusted by the similar way, as previously mentioned, that the threshold voltage is determined by the channel doping near the source/drain junction. The impurity region having the same type as of the source/drain region can be made under the vicinity of the floor by adjusting the opposite type impurity concentration when the opposite type impurity is doped for lowering the threshold voltage under the recessed channel floor. That is, the adjustment can be performed by slightly lowering the original doping or increasing the opposite type impurity concentration higher than the original channel doping. As such, the depth of the region doped by the opposite type impurity is indicated as d16 as shown in FIG. 20(b), and it is properly formed in a range between 0.1 nm and 100 nm. In FIGS. 20(a) and (b), the impurity can be formed with a Gaussian type profile in the lower region than the recessed region floor from the wall-type body surface of region (2). The d14 indicates that the doping concentration is made to be increased in the lower region than the recessed region floor in the wall-type body surface of region (2), and the peak concentration value is determined between $10^{15}$ cm$^{-3}$ and $2\times10^{19}$ cm$^{-3}$. The depth from the body surface to a position having peak concentration is properly determined in less than 500 nm.

Figure 21:
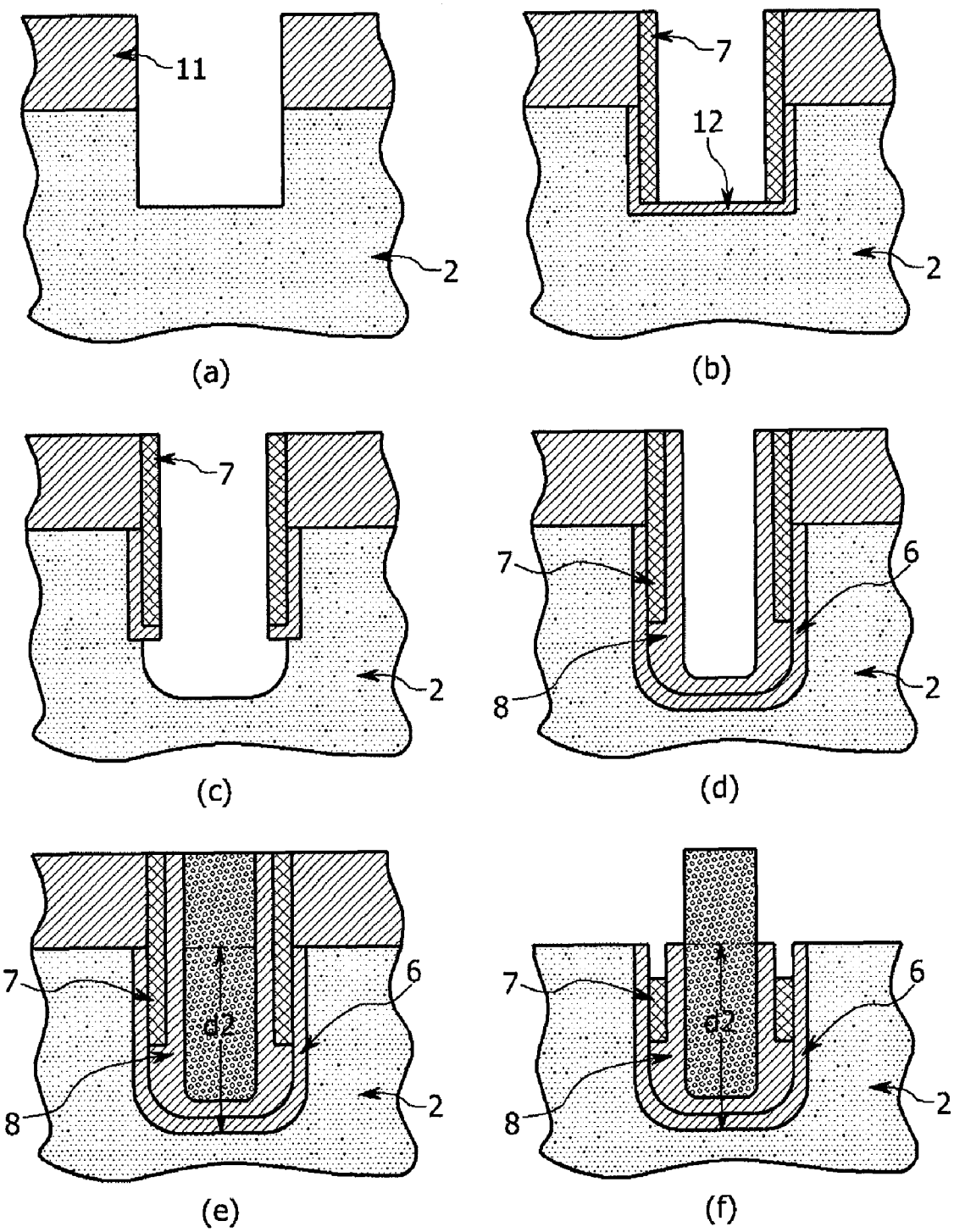
FIG. 21(a)-FIG. 21(f) are drawings showing the sequences of a fabrication process for the principal parts shown as an embodiment for realizing the device structure in accordance with the present invention.

FIG. 21 shows principal fabrication process steps as an embodiment of a process for implementing the device structure in accordance with the present invention. First, as shown in FIG. 21(a), the dielectric film of region (11) is formed after the device isolation process (formation of the field dielectric film). The wall-type body of region (2) exposed after removing first the region (11) through the mask work for forming the recess region is etched up to a proper depth. This is called as the etching step 1, and the etching depth is properly formed in a range less than the finally recessed depth. The surface treatment process for the recessed wall-type silicon body is performed, and then the dielectric film of region (12) is formed.

Subsequently, the charge storage node of region (7) is formed, that is if anisotorphic etching is performed, the spacer type charge storage node can be formed as shown in FIG. 21(b). Continuously, the dielectric film of the exposed region (12) is removed, and then the exposed silicon body is further etched in the etching step 2. As shown in FIG. 21(c), the corners formed near the floor of the final recessed region after the etching step 2 are formed as a round shape. After processing a proper surface treatment, the tunneling dielectric film of region (6) is formed. In fact, the regions remaining in left and right sides of the storage node without being etched among the dielectric film of region (12) formed before the formation of the storage node of region (7) becomes, in the end, the tunneling dielectric film of region (6). The thickness of the dielectric film of region (12) being the final tunneling dielectric film and the dielectric film of region (6) can be the same or different. Preferably, the thickness of the tunneling dielectric film formed after the etching step 2 is made of thicker, and thereby reducing the tunneling current of Fowler-Nordheim, which flows from the channel region except for the channel region in which the charge storage node is formed, to the control electrode of region (9). After forming the tunneling dielectric film, the inter-electrode dielectric film of region (8) is formed. This step is shown in FIG. 21(d).

Subsequently, the control electrode of region (9) is formed, and this step is shown in FIG. 21(e). FIG. 21(f) shows the cross-section of the storage node of region (7), which is implemented by properly etching the storage node of region (7) to a suitable length. Herein, the storage node of region (7) is exposed when removing the dielectric film of said region (11). The inter-electrode dielectric film of region (8) located at the sidewalls of the control electrode of region (9) which is protruded upward the wall-type body surface of region (2) can be also removed according to situations.

INDUSTRIAL APPLICABILITY

As described above, the present invention relates to a flash memory device and its fabricating method. In more details, it relates to a novel device structure for increasing memory capacity and improving scaling-down characteristic and performance of a MOS-based flash memory device, and thus is industrially applicable.

The invention claimed is:

1. A flash memory device comprising a structure, comprising:
    a wall-type semiconductor body region formed on a semiconductor substrate;
    a first dielectric film formed on a surface of said semiconductor substrate and a surface of said wall-type semiconductor body region;
    a device isolation field dielectric film, said device isolation field dielectric film being formed on said first dielectric film up to a vicinity of a surface of said wall-type semiconductor body region;
    a body recess region with a predetermined width and a predetermined depth from the surface of said wall-type semiconductor body region, disposed such that recessed channels are formed on the surface and a part of sides of said wall-type semiconductor body region in said body recess region;

a tunneling dielectric film formed on the surface and the part of the sides of said wall-type semiconductor body region;

a charge storage node formed on an upper region of said body recess region;

an inter-electrode dielectric film and a control electrode formed successively;

a source/drain formed on an upper region of said wall-type semiconductor body region;

a second dielectric film, a contact, and a metal layer, each formed with a predetermined width on a structure formed by said wall-type semiconductor body region, the first dielectric film, the device isolation field dielectric film, said body recess region, the tunneling dielectric film, the charge storage node, the inter-electrode dielectric film and the source/drain, wherein the device isolation field dielectric film of the flash memory device is patterned together with a mask pattern preformed for said body recess region and the first dielectric film.

2. The flash memory device comprising the structure according to claim 1, wherein said body recess region is recessed, and the first dielectric film and the device isolation field dielectric film are formed so as to be recessed with a predetermined depth from a surface along a region at which the control electrode is formed, the tunneling dielectric film being formed on the surface and a part of at least one side of the sides of said wall-type semiconductor body region, the upper region on which the charge storage node is formed is a surface and a part of a sidewall in said body recess region.

3. The flash memory device comprising the structure according to claim 2, wherein a portion of the device isolation field dielectric film and the first dielectric film are removed in a vicinity of an intersecting region of the control electrode and said body recess region, and the upper region on which the charge storage node is formed.

4. The flash memory device comprising the structure according to claim 2, wherein the upper region on which the charge storage node is formed is a vertical surface in said body recess region.

5. The flash memory device comprising the structure according to claim 2, wherein, a wall-type body of said wall-type semiconductor body region is formed such that a body width from a surface of said wall-type body to the semiconductor substrate is uniform, narrow in an upper side and widens in a direction of a semiconductor substrate side, or a uniform width is maintained from a surface of said wall-type body to a specified position and said body width is increased from beneath the surface of the wall-type body to the semiconductor substrate.

6. The flash memory device comprising the structure according to claim 2, wherein, in said body recess region, a recess width in a top of said body recess region is the same as a recess width in a vicinity of a bottom of said body recess region.

7. The flash memory device comprising the structure according to claim 2, wherein, in said body recess region, an edge between a surface and a side of said body recess region is formed using one of a right angle, an obtuse angle, and a round shape, such that durability of the flash memory device is increased.

8. The flash memory device comprising the structure according to claim 2, wherein a corner formed in a vicinity of a floor of the body recess region is formed using one of a right angle, an obtuse angle, and a round shape, such that durability of the flash memory device is increased.

9. The flash memory device comprising the structure according to claim 1, wherein the tunneling dielectric film comprises a silicon oxide film or a dielectric film with a high dielectric constant.

10. The flash memory device comprising the structure according to claim 4, wherein said body recess region formed in said wall-type semiconductor body region, and a vertical length of the charge storage node formed on the vertical surface and sides of said body recess region, are formed to each other.

11. The flash memory device comprising the structure according to claim 1, wherein said charge storage node comprises a conductive material or a dielectric material, wherein the conductive material comprises at least one of polysilicon, amorphous silicon, poly-SiGe, poly Ge, amorphous Ge, single and binary metals, and silicide, and the dielectric material comprises a nitride film that stores electric charges or a dielectric film that has a high dielectric constant.

12. The flash memory device comprising the structure according to claim 11, wherein, the dielectric material stores electric charges or an electrically isolated plurality of nanoscale dots, the electric charges or electrically isolated plurality of nanoscale dots are applied to form the charge storage node, 2-bit or more than 2-bit can be stored in a cell with storing 1-bit respectively in source side and drain side.

13. The flash memory device comprises the structure according to claim 12, further comprising a plurality of cells wherein, when the charge storage node is formed, the charge storage node is limitedly formed around a cell by using an additional mask pattern in order to isolate the charge storage node between cells in a direction of a word-line, or the charge storage node is formed around a cell using a self alignment technique and without the additional mask.

14. The flash memory device comprising the structure according to claim 2, wherein the inter-electrode dielectric film is a single layer or a multilayer inter-electrode dielectric film;

wherein the multilayer inter-electrode dielectric film is composed of a plurality of dielectric materials each having a different dielectric constant, band gap, and dielectric property.

15. The flash memory device comprising the structure according to claim 2, wherein, the control electrode is formed to wrap a channel formed on a floor of said body recess region in a vicinity of the floor of the body recess region and a side channel formed on both sides, and a vertical distance or width wrapping both sides is in a range of 1 nm to 50 nm.

16. The flash memory device comprising the structure according to claim 1, wherein only a region around a bottom of the body recess region of the wall-type semiconductor body is doped by a same impurity type as a doping impurity for the source/drain.

17. The flash memory device comprising the structure according to claim 2, wherein only a region around a bottom of the body recess region of the wall-type semiconductor body is doped by a same impurity type of the source/drain.

18. The flash memory device comprising the structure according to claim 2, wherein said wall-type semiconductor body region is formed on said semiconductor substrate and the first dielectric film with a thickness of from 0.5 nm to 50 nm is formed, a defect which occurs after forming the first dielectric film is removed through forming a nitride film on the first dielectric film, wherein the nitride film is maintained for exposing sides of said body recess region.

19. The flash memory device comprising the structure according to claim 2, wherein, in said body recess region, a recess width in a top of said body recess region is different from a recess width in a vicinity of a bottom of said body recess region.

20. The flash memory device comprising the structure according to claim 4, wherein said body recess region formed in said wall-type semiconductor body region, and a vertical length of the charge storage node formed on the vertical surface and sides of said body recess region, are formed to be different from each other.

* * * * *

UNITED STATES PATENT AND TRADEMARK OFFICE
CERTIFICATE OF CORRECTION

| | | |
|---|---|---|
| PATENT NO. | : 7,872,297 B2 | |
| APPLICATION NO. | : 11/736114 | |
| DATED | : January 18, 2011 | |
| INVENTOR(S) | : J. Lee | |

It is certified that error appears in the above-identified patent and that said Letters Patent is hereby corrected as shown below:

At column 16, lines 12 and 13 (claim 10, lines 5 and 6)
"to each other." should read --to be equal to each other.--.

Signed and Sealed this
Tenth Day of May, 2011

David J. Kappos
*Director of the United States Patent and Trademark Office*